United States Patent
Kinoshita et al.

(10) Patent No.: US 9,891,841 B2
(45) Date of Patent: Feb. 13, 2018

(54) STORAGE SYSTEM INCLUDING A PLURALITY OF MEMORY NODES CONNECTED THROUGH FIRST AND SECOND GROUPS OF INTERFACES

(71) Applicant: Toshiba Memory Corporation, Minato-ku (JP)

(72) Inventors: Atsuhiro Kinoshita, Kamakura (JP); Hiroshi Komuro, Sayama (JP); Hiroshi Sasagawa, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 85 days.

(21) Appl. No.: 14/408,120

(22) PCT Filed: Mar. 14, 2014

(86) PCT No.: PCT/JP2014/056962
§ 371 (c)(1),
(2) Date: Dec. 15, 2014

(87) PCT Pub. No.: WO2015/098138
PCT Pub. Date: Jul. 2, 2015

(65) Prior Publication Data
US 2015/0293710 A1    Oct. 15, 2015

(30) Foreign Application Priority Data
Dec. 27, 2013  (JP) .................... 2013-272300

(51) Int. Cl.
*G06F 12/00*    (2006.01)
*G06F 13/00*    (2006.01)
(Continued)

(52) U.S. Cl.
CPC .......... *G06F 3/0613* (2013.01); *G06F 3/0629* (2013.01); *G06F 3/0653* (2013.01);
(Continued)

(58) Field of Classification Search
CPC ........ G06F 3/0613; G06F 3/06; G06F 3/0659; G06F 3/0658; G06F 3/0653;
(Continued)

(56) References Cited

U.S. PATENT DOCUMENTS

| 5,550,986 A | 8/1996 | Dulac |
| 7,222,259 B2 | 5/2007 | Tanaka et al. |

(Continued)

FOREIGN PATENT DOCUMENTS

| JP | 07-084876 A | 3/1995 |
| JP | 09-297663 A | 11/1997 |

(Continued)

OTHER PUBLICATIONS

International Search Report dated May 13, 2014 in PCT/JP2014/056962 filed Mar. 14, 2014 (with English translation of Category of Cited Documents).

(Continued)

*Primary Examiner* — Tuan Thai
*Assistant Examiner* — Shane Woolwine
(74) *Attorney, Agent, or Firm* — Oblon, McClelland, Maier & Neustadt, L.L.P.

(57) ABSTRACT

A storage system includes a memory unit group that includes a first memory unit and a plurality of second memory units, and the first memory unit is connected to the plurality of second memory units so that data can be transmitted between the first memory unit and the second memory units. The plurality of second memory units is mounted on a same first substrate. One second memory unit of the plurality of second memory units cooperates with the first memory unit and does not cooperate with the other second memory units of the plurality of second memory units.

6 Claims, 30 Drawing Sheets

(51) Int. Cl.
  *G06F 13/28* (2006.01)
  *G06F 3/06* (2006.01)
(52) U.S. Cl.
  CPC .......... *G06F 3/0659* (2013.01); *G06F 3/0688* (2013.01); *G06F 3/0689* (2013.01); *G06F 12/00* (2013.01)
(58) Field of Classification Search
  CPC .... G06F 3/0665; G06F 3/0688; G06F 3/0689; G06F 3/0629; G06F 12/00
  USPC .................. 711/103, 104, 112, 161, 162, 114
  See application file for complete search history.

(56) References Cited

U.S. PATENT DOCUMENTS

| | | | |
|---|---|---|---|
| 7,424,639 B2 | 9/2008 | Tanaka et al. | |
| 7,562,271 B2 | 7/2009 | Shaeffer et al. | |
| 7,685,364 B2 | 3/2010 | Shaeffer et al. | |
| 8,108,607 B2 | 1/2012 | Shaeffer et al. | |
| 8,539,152 B2 | 9/2013 | Shaeffer et al. | |
| 2004/0148482 A1* | 7/2004 | Grundy .................. | G06F 12/06 711/167 |
| 2006/0047899 A1 | 3/2006 | Ilda et al. | |
| 2007/0067554 A1* | 3/2007 | Hinrichs ............. | G06F 13/4234 710/316 |
| 2008/0276032 A1 | 11/2008 | Ilda et al. | |
| 2010/0241607 A1* | 9/2010 | Fujioka .................. | G06F 11/008 706/52 |
| 2012/0117354 A1 | 5/2012 | Tatsumura et al. | |
| 2012/0124415 A1* | 5/2012 | Borkenhagen ...... | G06F 11/1666 714/6.3 |
| 2013/0238836 A1* | 9/2013 | Suzuki ............... | G11C 16/3431 711/103 |
| 2014/0223068 A1 | 8/2014 | Shaeffer et al. | |

FOREIGN PATENT DOCUMENTS

| | | |
|---|---|---|
| JP | 2004-272527 A | 9/2004 |
| JP | 2006-065697 A | 3/2006 |
| JP | 2007-219846 A | 8/2007 |
| JP | 2010-524089 A | 7/2010 |
| JP | 2012-103926 A | 5/2012 |

OTHER PUBLICATIONS

Office Action dated Jul. 22, 2014 in Japanese Patent Application No. 2013-272300 (with English language translation).

* cited by examiner

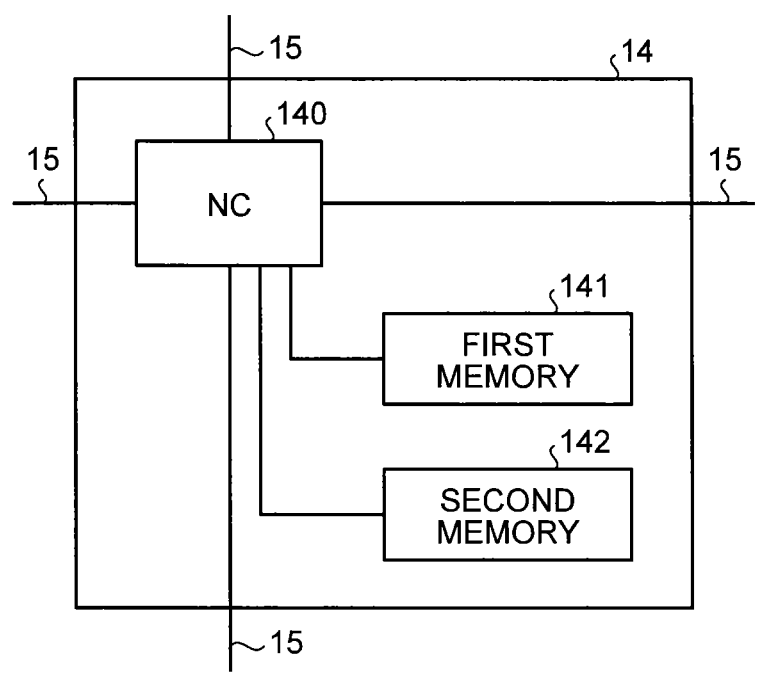

STORAGE SYSTEM INCLUDING A PLURALITY OF MEMORY NODES CONNECTED THROUGH FIRST AND SECOND GROUPS OF INTERFACES

CROSS-REFERENCE TO RELATED APPLICATIONS

This application is national stage application of International Application No. PCT/JP2014/056962, filed Mar. 14, 2014, which designates the United States, incorporated herein by reference, and which claims the benefit of priority from Japanese Patent Application No. 2013-272300, filed on Dec. 27, 2013, the entire contents of each of which are incorporated herein by reference.

TECHNICAL

Embodiments described herein relate generally to a storage system.

BACKGROUND

The number of cases in which a plurality of information processors including storage systems is connected to one another through a network and are operated as one information processing system (for example, cloud computing) has increased in recent years. Further, as a storage system, there is a storage system which is faster than a storage system using a HDD in the related art and is used as one storage system and in which a plurality of DRAM chips, NAND flash chips, or the like is lined up and is connected to one another through wiring.

BRIEF DESCRIPTION OF THE DRAWINGS

FIG. 2 is a diagram illustrating an example of the configuration of NM.

FIG. 3 is a diagram illustrating the configuration of a packet.

DETAILED DESCRIPTION

In general, according to one embodiment, a storage system includes a memory unit group that includes a first memory unit and a plurality of second memory units. The first memory unit is connected to the plurality of second memory units so that data is transmitted between the first memory unit and the second memory units. The plurality of second memory units is mounted on a same first substrate. One second memory unit of the plurality of second memory units cooperates with the first memory unit and does not cooperate with the other second memory units of the plurality of second memory units.

Storage systems according to embodiments will be described in detail below with reference to the accompanying drawings. Meanwhile, the invention is not limited to these embodiments.

[First Embodiment]

Figure 1:
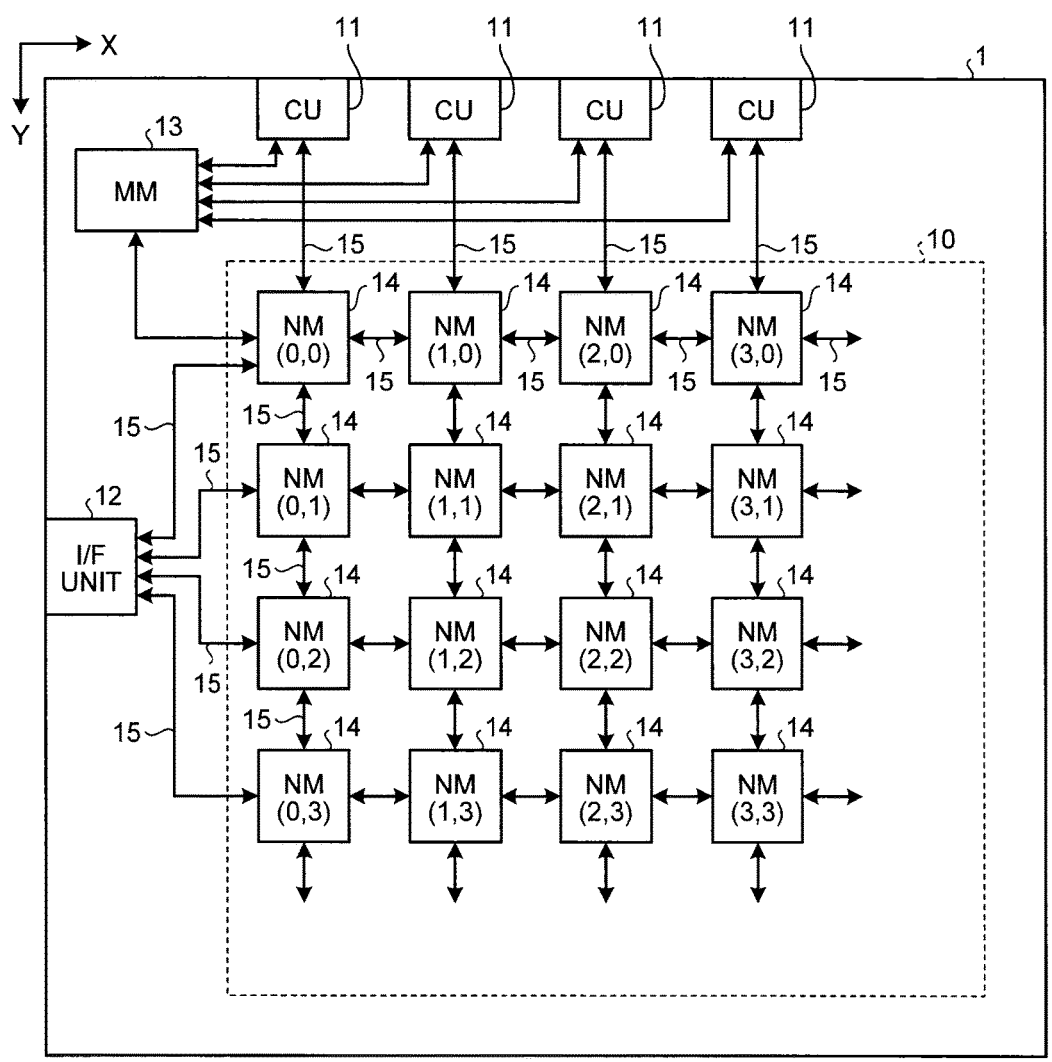
FIG. 1 is a diagram illustrating the concept of the configuration of a storage system.

First, the concept of the configuration of a storage system of an embodiment will be described. FIG. 1 is a diagram illustrating the concept of the configuration of a storage system. As illustrated in FIG. 1, the storage system 1 includes a memory unit 10, connection units (CU) 11, an interface unit (I/F unit) 12, and a management module (MM) 13.

The memory unit 10 has a configuration in which a plurality of node modules (NM) 14 having a memory function and a data transmission function are connected to one another through a mesh network. The memory unit 10 distributes and stores data in the plurality of NMs 14. The data transmission function has a transmission method that allows the respective NMs 14 to efficiently transmit packets.

FIG. 1 illustrates an example of a rectangular network in which the respective NMs 14 are arranged at lattice points. The coordinates of each lattice point are represented by coordinates (x,y), and the position information of the NM 14 arranged at each lattice point corresponds to the coordinates of each lattice point and is represented by a node address $(x_D,y_D)$. Further, in the example of FIG. 1, an NM 14 positioned at the left top corner has an node address (0,0) of the origin and the node address is increased and decreased by an integer value when each NM 14 moves in a horizontal direction (X direction) and a vertical direction (Y direction).

Each NM 14 includes two or more interfaces 15. Each NM 14 is connected to adjacent NMs 14 through the interfaces 15. Each NM 14 is connected to adjacent NMs 14 in two or more different directions. For example, an NM 14, which is arranged at the left top corner in FIG. 1 and represented by the node address (0,0), is connected to an adjacent NM 14 represented by an node address (1,0) in the X direction and an adjacent NM 14 represented by an node address (0,1) in the Y direction, which is a direction different from the X direction. Further, an NM 14, which is represented by an node address (1,1) in FIG. 1, is connected to four adjacent NMs 14 represented by node addresses (1,0), (0,1), (2,1), and (1,2) in four directions different from one another. Hereinafter, an NM 14, which is represented by a node address $(x_D,y_D)$, will be denoted by a node $(x_D,y_D)$.

The respective NMs 14 are illustrated in FIG. 1 so as to be arranged at the lattice points of a rectangular lattice, but the aspect of the arrangement of the respective NMs 14 is not limited to this example. That is, the shape of the lattice has only to allow each NM 14, which is arranged at a lattice point, to be connected to NMs 14 that are adjacent to the NM 14 in two or more different directions, and may be, for example, a triangular shape, a hexagonal shape, or the like. Further, the respective NMs 14 are two-dimensionally arranged in FIG. 1, but may be three-dimensionally arranged. When NMs 14 are three-dimensionally arranged, each NM 14 can be designated by three values, that is, (x,y,z). Furthermore, when NMs 14 are two-dimensionally arranged, the NMs 14 may be connected in a torus shape by the connection between NMs 14 that are positioned on sides facing each other.

The CU 11 includes a connector that is connected to the outside, and can input/output data to/from the memory unit 10 according to a request from the outside. Specifically, the CU 11 includes a memory unit and an processing unit that are not illustrated. The processing unit can execute a program of a server application by using the memory unit as a work area. The CU 11 processes a request from the outside under the control that is performed by the server application. The CU 11 executes access to the memory unit 10 while processing the request from the outside. The CU 11 generates a packet that can be transmitted or executed by the NM 14 when having access to the memory unit 10, and sends the generated packet to the NM 14 that is connected to the CU 11 itself.

In the example of FIG. 1, the storage system 1 includes four CUs 11. The four CUs 11 are connected to different NMs 14. Here, the four CUs 11 are connected to a node (0,0), a node (1,0), a node (2,0), and a node (3,0) with a one-to-one relationship. Meanwhile, the number of the CUs 11 can be arbitrarily. Further, the CUs 11 can be connected to arbitrary NMs 14 of the memory unit 10. Furthermore, one CU 11 may be connected to a plurality of NMs 14, and one NM 14 may be connected to a plurality of CUs 11. Moreover, the CU 11 may be connected to an arbitrary NM 14 among the plurality of NMs 14 of the memory unit 10.

FIG. 2 is a diagram illustrating an example of the configuration of NM 14. The NM 14 includes a node controller (NC) 140, a first memory 141 that functions as a storage, and a second memory 142 that is used as a work area by the NC 140. A NAND memory, a Bit-cost scalable memory (BiCS), a magnetoresistive random-access memory (MRAM), a phase-change memory (PcRAM), a resistive random-access memory (RRAM (registered trademark)), or the combination thereof can be applied as the first memory 141. Various RAMs can be applied as the second memory 142. Meanwhile, when the first memory 141 provides a function as a work area, the NM 14 may not include the second memory 142.

Four interfaces 15 are connected to the NC 140. The NC 140 receives a packet from the CU 11 or other NMs 14 through the interfaces 15, or sends a packet to the CU 11 or other NMs 14 through the interfaces 15. When a transmission destination of the received packet is a subject NM 14, the NC 140 of the subject NM 14 performs processing corresponding to the packet (a command recorded in the packet). The transmission destination means a NM 14 which is a final destination of the packet. For example, when a command is an access command (a read command or a write command), the NC 140 executes access to the first memory 141. When the transmission destination of the received packet is not a subject NM 14, the NC 140 of the subject NM 14 transmits the packet to the other NM 14 that is connected to the subject NM 14.

FIG. 3 is a diagram illustrating the configuration of a packet. The node address of a destination (a transmission destination), the node address of a transmission source, and a command or data is recorded in the packet.

When a NC 140 having received a packet determines a routing destination on the basis of a predetermined transmission algorithm, the packet is transmitted between NMs 14 and reaches a NM 14 corresponding to a transmission destination. For example, the NC 140 determines a NM 14, which is positioned on a path on which the number of times of the transmission of a packet from a subject NM 14 to a NM 14 corresponding to a trasmission destination becomes minimum, among the plurality of NMs 14, which are connected to the subject NM 14, as a NM 14 corresponding to a routing destination. When there are a plurality of paths on which the number of times of the transmission of a packet from a subject NM 14 to a NM 14 corresponding to a transmission destination becomes minimum, a NC 140 selects one path from the plurality of paths by an arbitrary method. When a NM 14, which is positioned on a path on which the number of times of the transmission of a packet becomes minimum, among the plurality of NMs 14, which are connected to the subject NM 14, is broken down or is busy, a NC 140 determines the other NM 14 as a routing destination.

Since the memory unit 10 has a configuration in which a plurality of NMs 14 is connected to one another through a mesh network, there are a plurality of paths on which the number of times of the transmission of a packet becomes minimum. Even when a plurality of packets of which the transmission destination is a specific NM 14, the plurality of issued packets is distributed to a plurality of paths and is transmitted by the above-mentioned transmission algorithm. Accordingly, the reduction of the throughput of the entire storage system 1, which is caused by the concentration of access to the specific NM 14, is suppressed.

Figure 4:
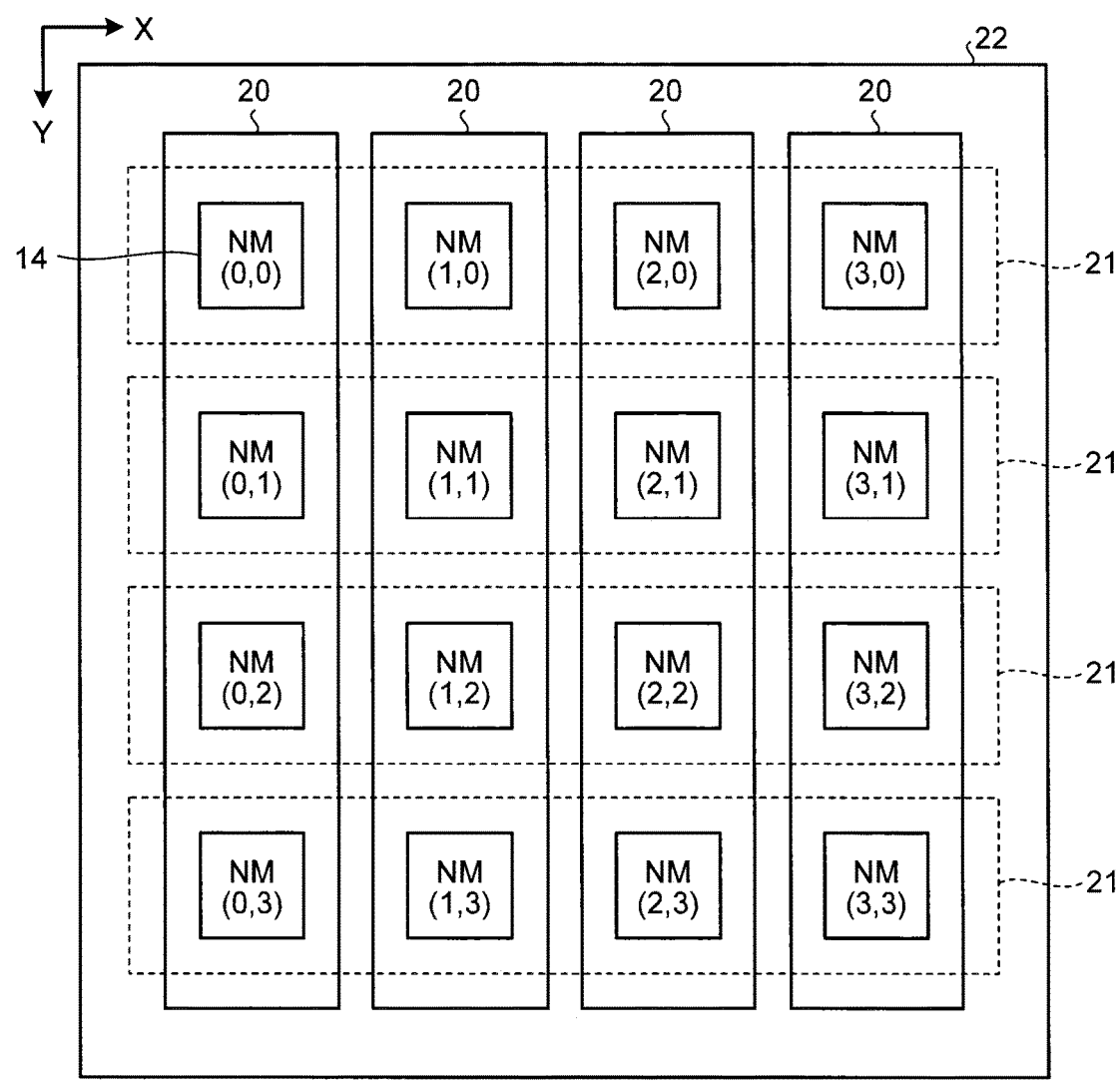
FIG. 4 is a diagram illustrating a mounting example of NMs.

FIG. 4 is a diagram illustrating a mounting example of NMs 14. The respective NMs 14 are mounted on card substrates 20. Four card substrates 20 are detachably mounted on a backplane 22 through connectors. Four NMs 14 are mounted on each card substrate 20. Four NMs 14, which are arranged in the Y direction, are mounted on the same card substrate 20, and four NMs 14, which are arranged in the X direction, are mounted on different card substrates 20. Here, redundant arrays of inexpensive disks (RAID) can be built in the memory unit 10. For example, four RAID groups 21 are built in the example illustrated in FIG. 4, and each NM 14 belongs to any one of the four RAID groups 21. Further, four NMs 14, which are mounted on different card substrates 20, form one RAID group 21. Here, four NMs 14, which are arranged in the X direction, belong to the same RAID group 21. The level of RAID to be applied is arbitrary. For example, if one of a plurality of NMs 14 forming the RAID group 21 is damaged, data stored in the damaged NM 14 is restored by the exchange of a card substrate 20 including the damaged NM 14 when RAID 5 is applied. Furthermore, even though two NMs 14 of the plurality of NMs 14 forming the RAID group 21 are damaged, data stored in the damaged NMs 14 can be restored when RAID 6 is applied.

The MM 13 is connected to the respective CUs 11 and the node (0,0). The MM 13 includes a base management controller (BMC) (not illustrated). The MM 13 performs the monitoring of environmental temperature, the monitoring and control of the rotation speed of a fan, the monitoring of a power supply current and a power supply voltage, the recording of the status of the respective CUs 11, the monitoring of the temperature of the respective CUs 11, the reset of the CUs 11, and the like as a part of the function of the BMC. Further, the MM 13 has a function of performing processing (NM control processing) on the memory unit 10 in addition to the function of the BMC. The NM control processing is optional. For example, when the first memory 141 is formed of a flash memory, the MM 13 may perform the wear leveling of the first memory 141. Furthermore, when the breakdown of the MM 14 is detected, the MM 13 may notify the outside of the exchange of the card substrate 20 on which the broken-down MM 14 is mounted. Moreover, the MM 13 may rebuild RAID after the exchange of the card substrate 20. Meanwhile, the detection of the breakdown of the MM 14 may be performed by the NC 140, and may be performed by the CU 11. The detection of the breakdown of the MM 14 may be performed on the basis of the detection of an error of read data obtained from the first memory 141 that is included in the MM 14. When performing processing on the memory unit 10, the MM 13 issues a packet corresponding to the processing. The MM 13 issues a packet that complies with a form illustrated in, for example, FIG. 3.

The I/F unit 12 is a connection interface that is used to expand the memory unit 10. When two different storage systems 1 are connected to each other through the I/F units 12, the memory units 10 of the respective storage systems 1 are logically connected to each other and can be used as one memory unit 10. The I/F unit 12 is connected to one or more NMs 14 through the interfaces 15. Here, the respective interfaces 15, which are connected to four NMs 14, that is, a node (0,0), a node (0,1), a node (0,2), and a node (0,3), are connected to the I/F unit 12.

Figure 5:
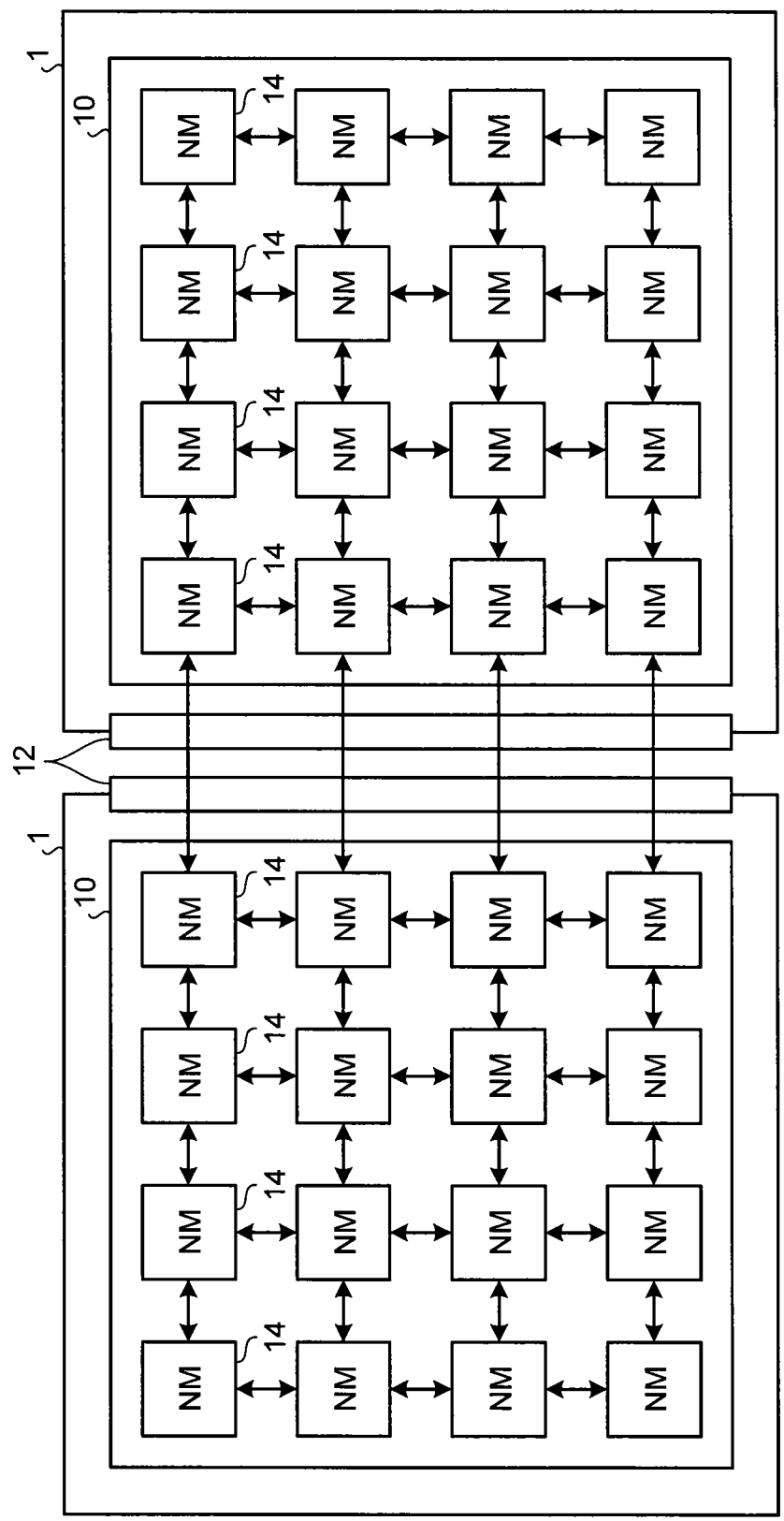
FIG. 5 is a diagram illustrating a connection relationship among NMs when two storage systems are connected to each other through I/F units.

FIG. 5 is a diagram illustrating a connection relationship among the NMs 14 when two storage systems 1 are connected to each other through I/F units 12. As illustrated in FIG. 5, four NMs 14 included in one storage system 1 of two storage systems 1 are connected to four NMs 14 included in the other storage system of two storage systems 1 through the I/F units 12 with a one-to-one relationship. Packets can be transmitted between the two storage systems 1 through the interfaces 15 that are connected to each other by the I/F units 12. Accordingly, two memory units 10 each which is formed of a group of NMs 14 having four lines and four columns are logically connected to each other, and can be used as one memory unit 10 that is formed of a group of NMs 14 having four lines and eight columns.

Meanwhile, which NMs 14 are connected to the I/F unit 12 among the plurality of NMs 14, which form the memory unit 10, and the number of the NMs 14 connected to the I/F unit 12 are arbitrary. Further, the variation of a connection relationship between the memory units 10 will be described below.

Next, the mounting example of the first embodiment will be described.

Figure 6:
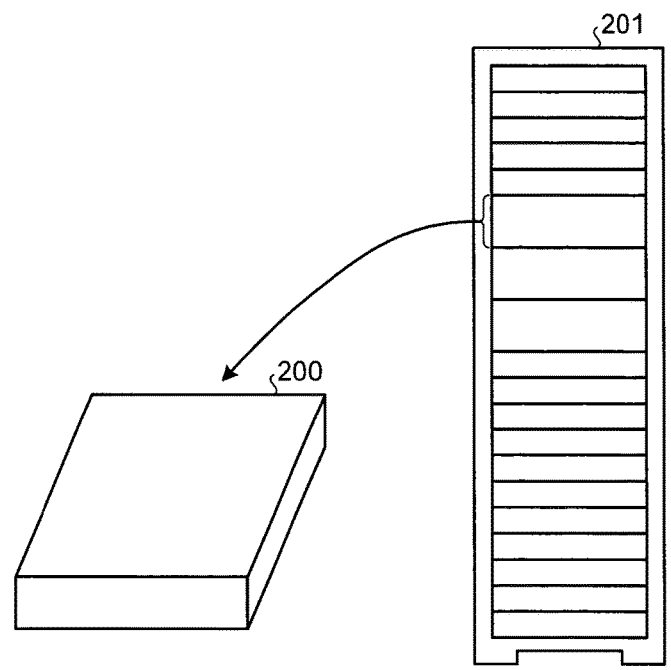
FIG. 6 is a diagram illustrating an enclosure in which storage systems are accommodated.

FIG. 6 is a diagram illustrating a housing (enclosure) in which the storage systems 1 are accommodated. The storage systems 1 are accommodated in an enclosure 200 that can be mounted on a server rack 201. The dimensions of the enclosure 200 are specified in a standard with which the server rack 201 complies. Height among the dimensions of the enclosure 200 is denoted by "U (unit)". For example, the enclosure 200 has a height of "2 U".

Figure 7:
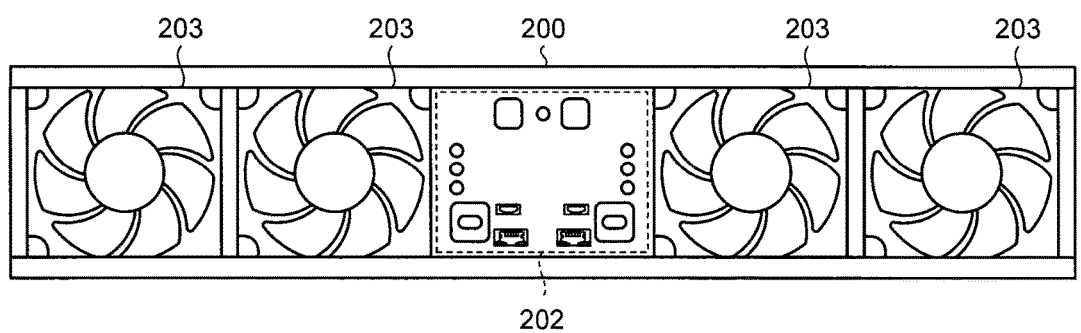
FIG. 7 is a front view of the enclosure.
Figure 8:
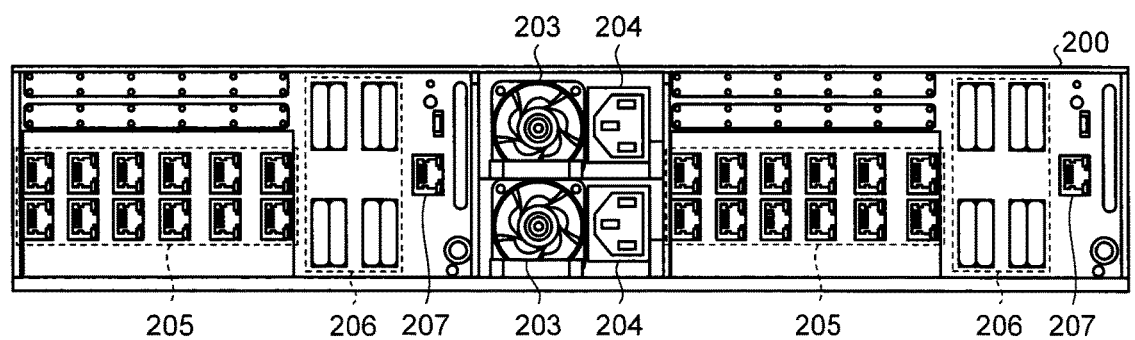
FIG. 8 is a rear view of the enclosure.
Figure 9:
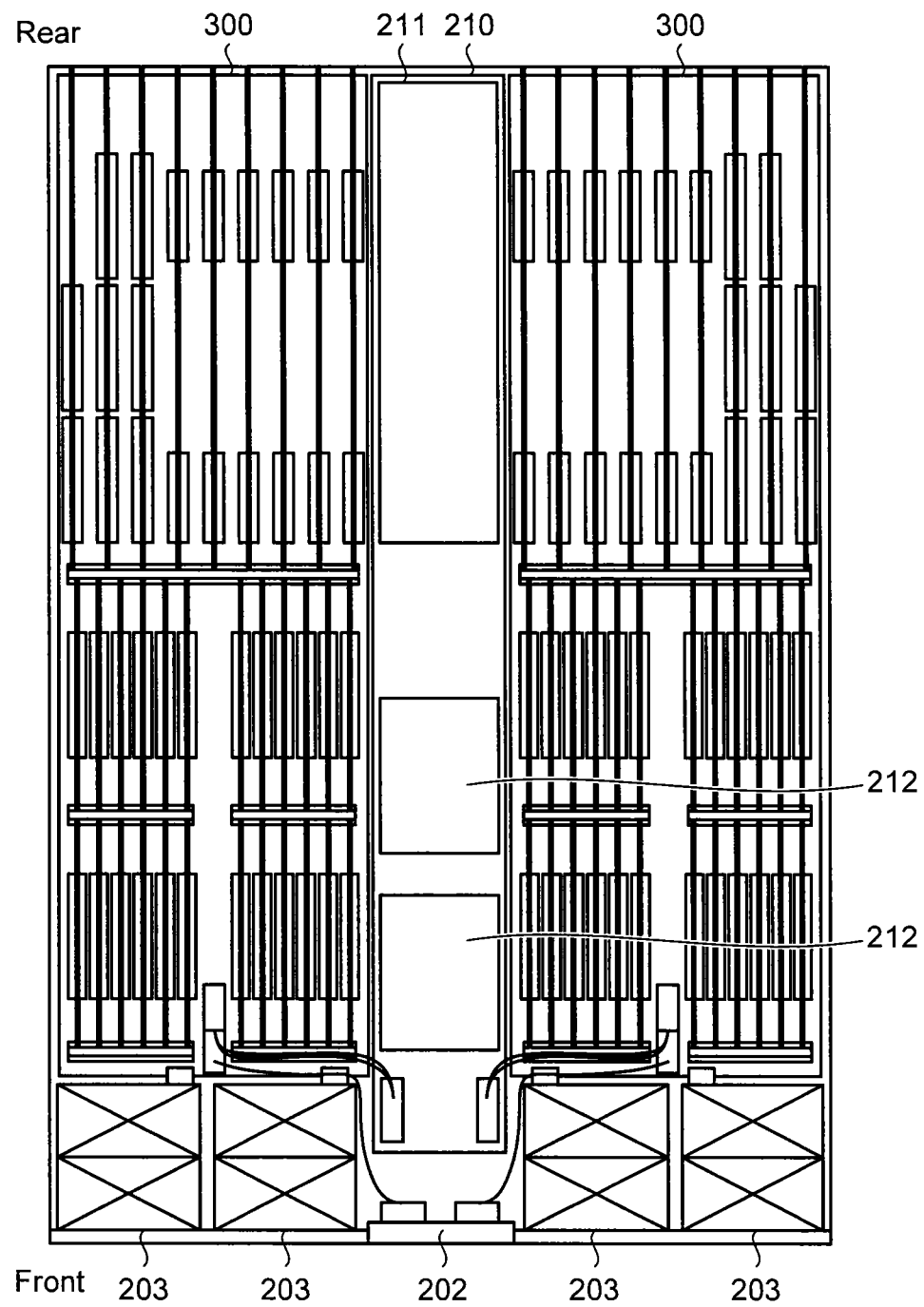
FIG. 9 is a top view of the inside of the enclosure.

FIG. 7 is a front view of the enclosure 200, FIG. 8 is a rear view of the enclosure 200, and FIG. 9 is a top view of the inside of the enclosure 200.

A console panel 202 on which a power button, various LEDs, and various connectors are provided is provided at the middle of the front surface of the enclosure 200. Two fans 203, which suck or discharge air, are provided on each of the left and right sides of the console panel 202.

Two fans 203 for cooling power supplies 211 to be described below and two power connectors 204 are provided at the middle portion of the rear surface of the enclosure 200. Further, six pairs of connectors 205, that is, a total of twelve connectors 205 that are used for connection between the CUs 11 and the outside, four pairs of connectors 206, that is, a total of eight connectors 206 that are used for connection between the I/F unit 12 and the outside, and one connector 207 that is used for connection between the MM 13 and the outside are provided on each of the left and right sides of the middle portion.

Meanwhile, a connector, which complies with an Ethernet (registered trademark) standard, is employed as the standard of the connector 205 in this description, but an arbitrary standard can be employed as the standard of the connector 205 as long as network connection is possible. Furthermore, an arbitrary standard can be employed as the standard of the connector 206. Here, low voltage differential signaling (LVDS) is employed as an interface between the NMs 14, and LVDS is employed as the standard of the connector 206. Moreover, an arbitrary standard can be employed as the standard of the connector 207.

A backplane 210 for a power supply is accommodated at the middle portion in the enclosure 200. Further, backplanes 300 are accommodated on the left and right sides of the backplane 210 for a power supply. The CUs 11, the I/F unit 12, the MM 13, and the NMs 14, which are mounted on the card substrates, are mounted on each of the backplanes 300, and the storage systems function as one storage system 1. That is, two storage systems 1 can be accommodated in the enclosure 200. Meanwhile, the storage system 1 can be operated in a state in which one backplane 300 is accommodated in the enclosure 200. Furthermore, when two backplanes 300 are accommodated in the enclosure 200, two backplanes 300 are connected to each other through the connectors 206. Accordingly, the memory units 10 of the two storage systems 1 can be united and operated as one memory unit 10.

Two power supplies 211, which are stacked in the height direction of the enclosure 200, are connected to the backplane 210 for a power supply on the rear surface (Rear) side of the enclosure 200, and two batteries 212 are lined up and connected to each other on the front surface (Front) side of the enclosure 200 in the depth direction of the enclosure 200. The two power supplies 211 generate internal power by using commercial power that is supplied from the outside through the power connectors 204, and supply the generated internal power to the two backplanes 300 through the backplane 210 for a power supply. The two batteries 212 are backup power supplies that generate internal power at the time of the stop of the supply of commercial power such as a blackout.

Figure 10:
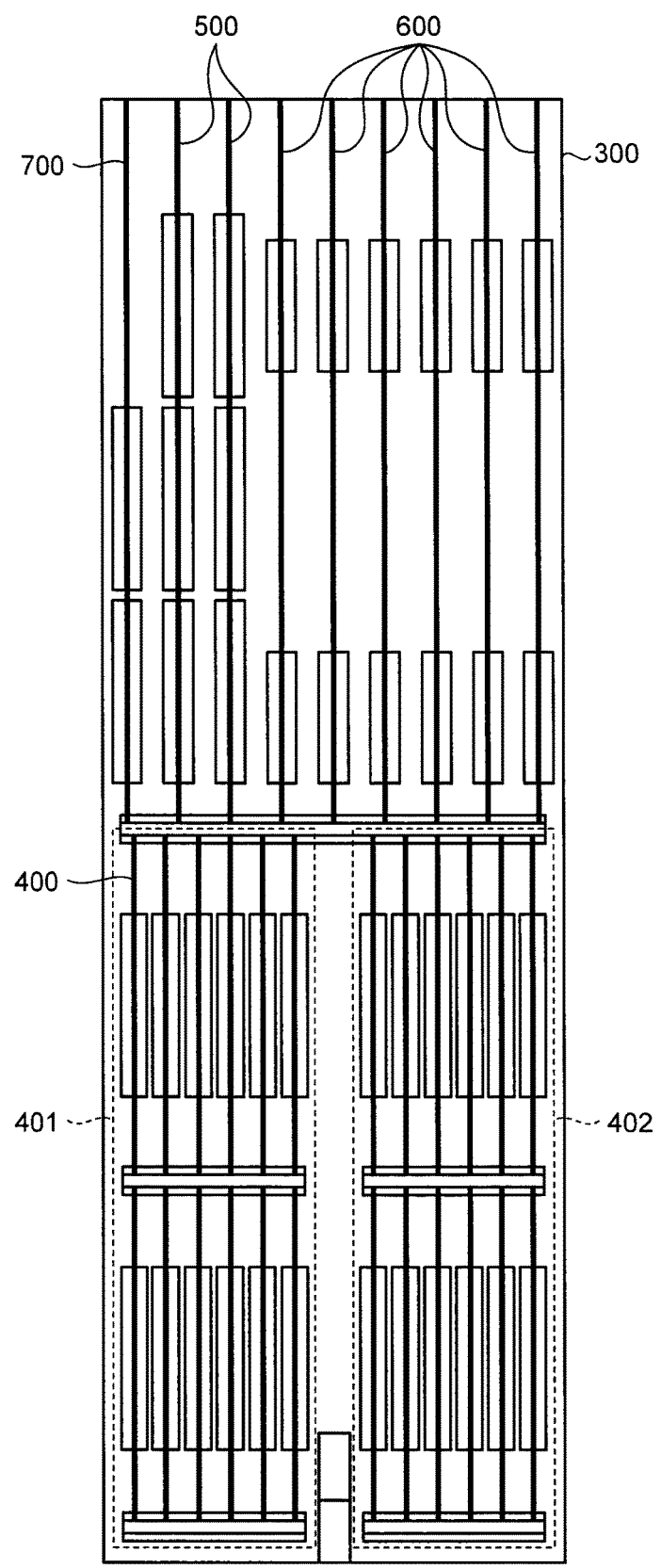
FIG. 10 is a diagram illustrating an example of the configuration of a backplane.

FIG. 10 is a diagram illustrating an example of the configuration of the backplane 300. The CUs 11, the I/F unit 12, the MM 13, and the NMs 14 are mounted on the respective card substrates. These card substrates are mounted in slots that are formed in the backplane 300. A card substrate on which the NMs 14 are mounted is represented as a NM card (NM card 400). A card substrate on which the I/F unit 12 is mounted is represented as an I/F card (I/F card 500). A card substrate on which the CUs 11 are mounted is represented as a CU card (CU card 600). A card substrate on which the MM 13 is mounted is represented as a MM card (MM card 700).

One MM card 700, two I/F cards 500, and six CU cards 600 are mounted from the left on the backplane 300 on the rear surface side. Further, twenty-four NM cards 400 are mounted on the backplane 300 so as to be arranged in two lines on the front surface side. The twenty-four NM cards 400 are classified into a block (a first block 401) that is formed of twelve NM cards 400 positioned on the left side in the plane of paper and a block (a second block 402) that is formed of twelve NM cards 400 positioned on the right side in the plane of paper. This classification is based on a mounting position.

Figure 11:
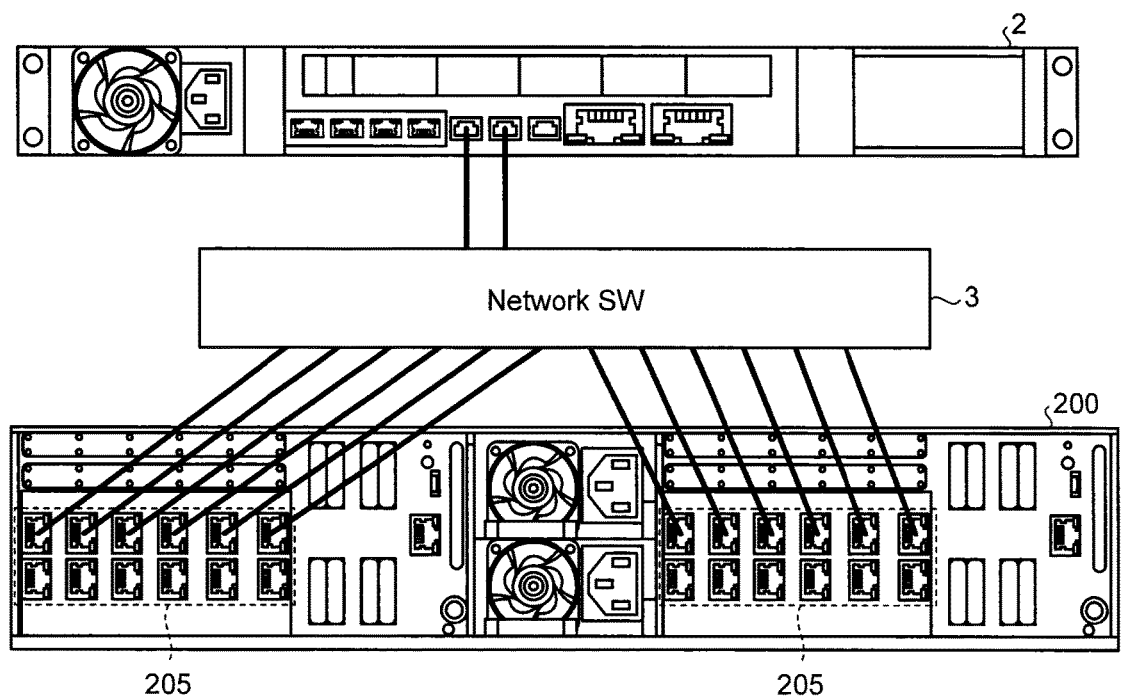
FIG. 11 is a diagram illustrating an example of the form of use of an enclosure of a first embodiment.

FIG. 11 is a diagram illustrating an example of the form of use of the enclosure 200. A PC server 2 is connected to the enclosure 200 through the connectors 205 and a network switch (Network SW) 3. The storage systems 1, which are accommodated in the enclosure 200, can interpret a request, which is sent from the PC server 2, in the CU cards 600 and can have access to the memory units 10. A server application is executed in the CU card 600. The PC server 2 can send a request that can be received by a server application. Meanwhile, here, the connector 205 and the network switch 3 are connected to each CU card 600. However, an arbitrary CU card 600 and the network switch 3 can be connected to each other.

Figure 12:
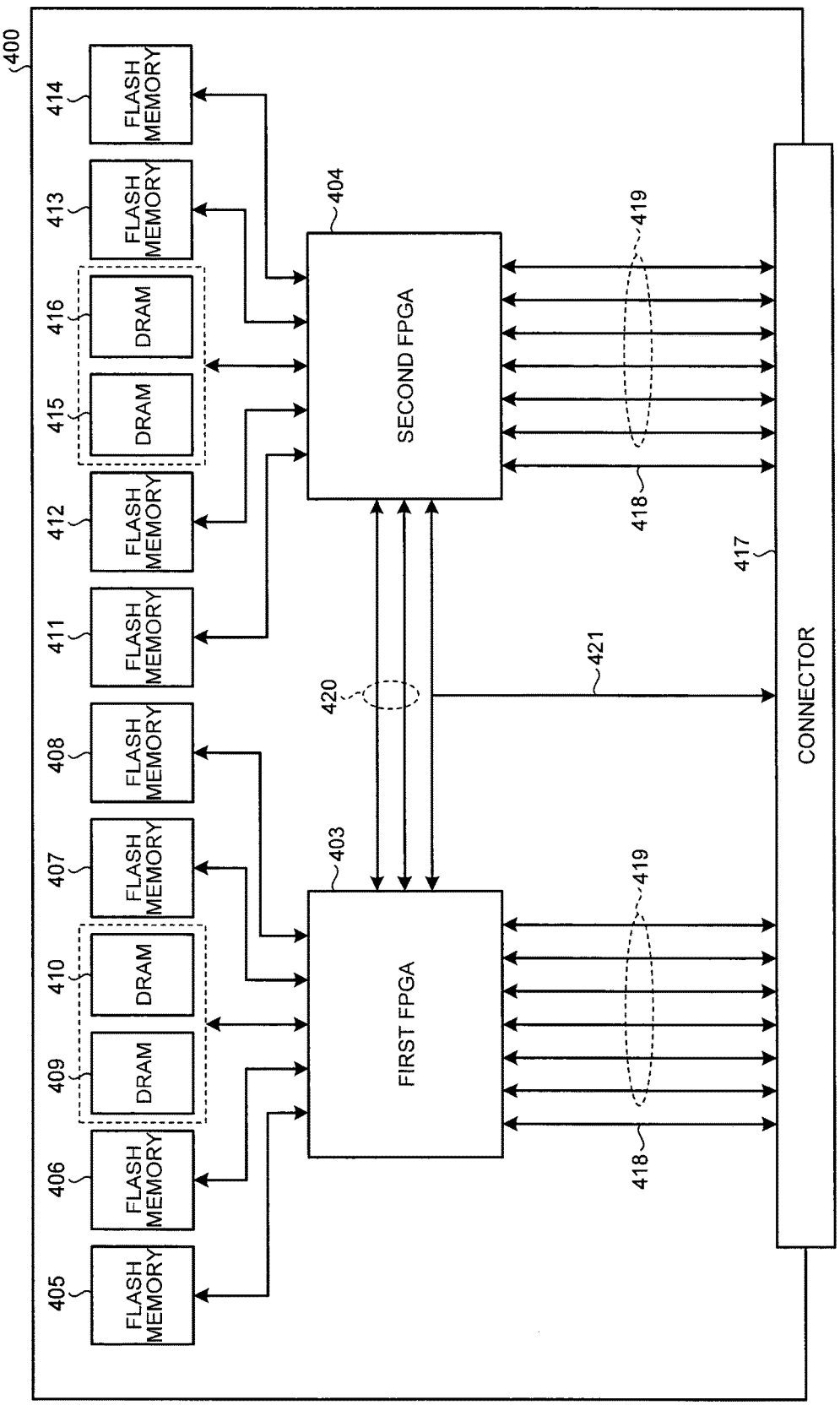
FIG. 12 is a block diagram illustrating the configuration of an NM card.
Figure 13:
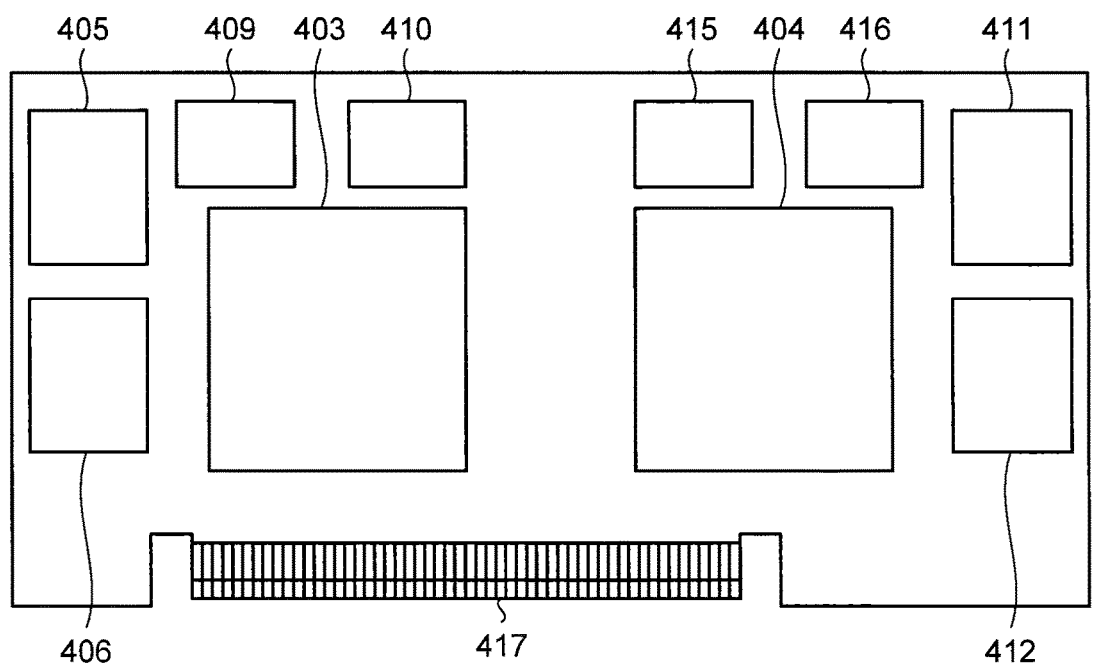
FIG. 13 is an overview diagram of the NM card.
Figure 14:
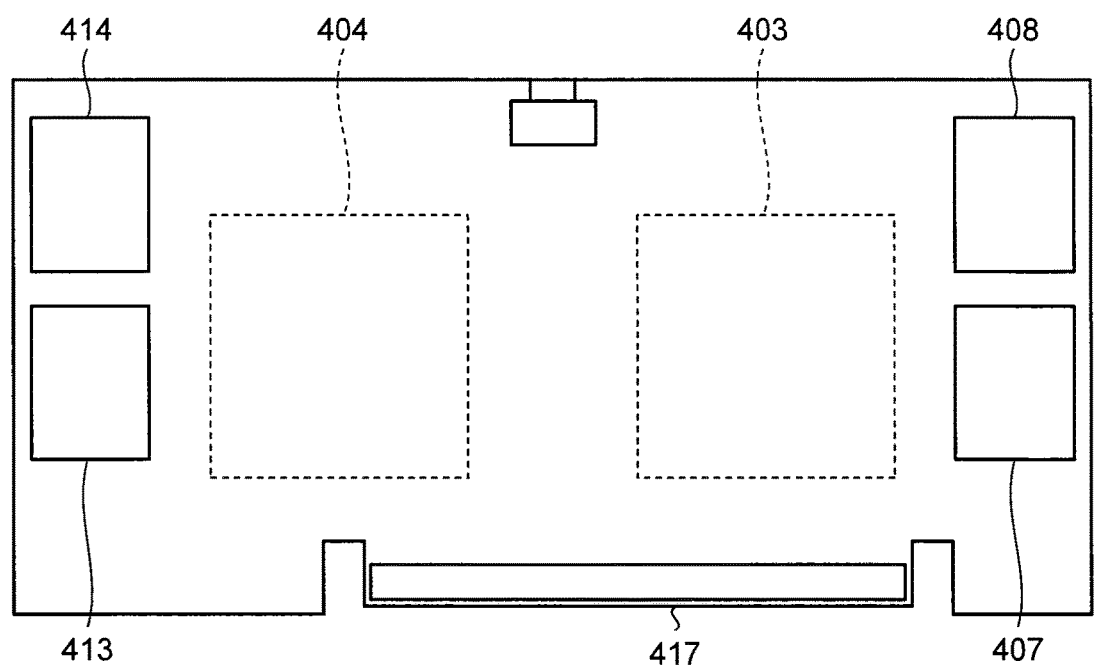
FIG. 14 is an overview diagram of the NM card.

FIG. 12 is a block diagram illustrating the configuration of the NM card 400. FIGS. 13 and 14 are the overview diagrams of the NM card 400. FIG. 13 illustrates one side of the NM card 400, and FIG. 14 illustrates the other side of the NM card 400. In this mounting example, LVDS is applied to the standard of the interface 15 connecting the NMs 14 and PCIe (PCI Express) is applied to the standard of the interface 15 connecting the NM 14 to the CU 11. Further, PCIe is applied to the standard of the interface connecting the NM 14 to the MM 13, and I2C and Ethernet are applied to the standard of the interface connecting the NM 14 to the CU 11.

The NM card 400 includes a first field-programmable gate array (FPGA) 403, a second FPGA 404, flash memories 405 to 408, DRAMs 409 and 410, flash memories 411 to 414, DRAMs 415 and 416, and a connector 417. As illustrated in FIGS. 13 and 14, the first FPGA 403, the flash memories 405 and 406, the DRAMs 409 and 410, and the flash memories 407 and 408 are provided so as to be symmetrical to the second FPGA 404, the flash memories 411 and 412, the DRAMs 415 and 416, and the flash memories 414 and 415 in terms of position, respectively, and the connector 417 is provided at a position eccentric from the center of symmetry.

The connector 417 is a connection mechanism that is physically and electrically connected to the slot formed in the backplane 300. The NM card 400 can communicate with the other cards through the connector 417 and wiring formed on the backplane 300.

The first FPGA 403 is connected to the four flash memories 405 to 408 and the two DRAMs 409 and 410. The first FPGA 403 includes four NCs 140 therein. The four NCs 140, which are included in the first FPGA 403, use the DRAMs 409 and 410 as the second memories 142. Further, the four NCs 140, which are included in the first FPGA 403, use different flash memories among the flash memories 405 to 408 as the first memories 141. That is, the first FPGA 403, the flash memories 405 to 408, and the DRAMs 409 and 410 correspond to a group of NMs 14 that is formed of the four NMs 14.

The second FPGA 404 is connected to the four flash memories 411 to 414 and the two DRAMs 415 and 416. The second FPGA 404 includes four NCs 140 therein. The four NCs 140, which are included in the second FPGA 404, use the DRAMs 415 and 416 as the second memories 142. Furthermore, the four NCs 140, which are included in the second FPGA 404, use different flash memories among the flash memories 411 to 414 as the first memories 141. That is, the second FPGA 404, the flash memories 411 to 414, and the DRAMs 415 and 416 correspond to a group of NMs 14 that is formed of the four NMs 14.

The first FPGA 403 is connected to the connector 417 through one PCIe interface 418 and six LVDS interfaces 419. Further, the second FPGA 404 is connected to the connector 417 through one PCIe interface 418 and six LVDS interfaces 419. The first FPGA 403 and the second FPGA 404 are connected to each other through two LVDS interfaces 420. Furthermore, the first FPGA 403 and the second FGPA 404 are connected to the connector 417 through an I2C interface 421.

Figure 15:
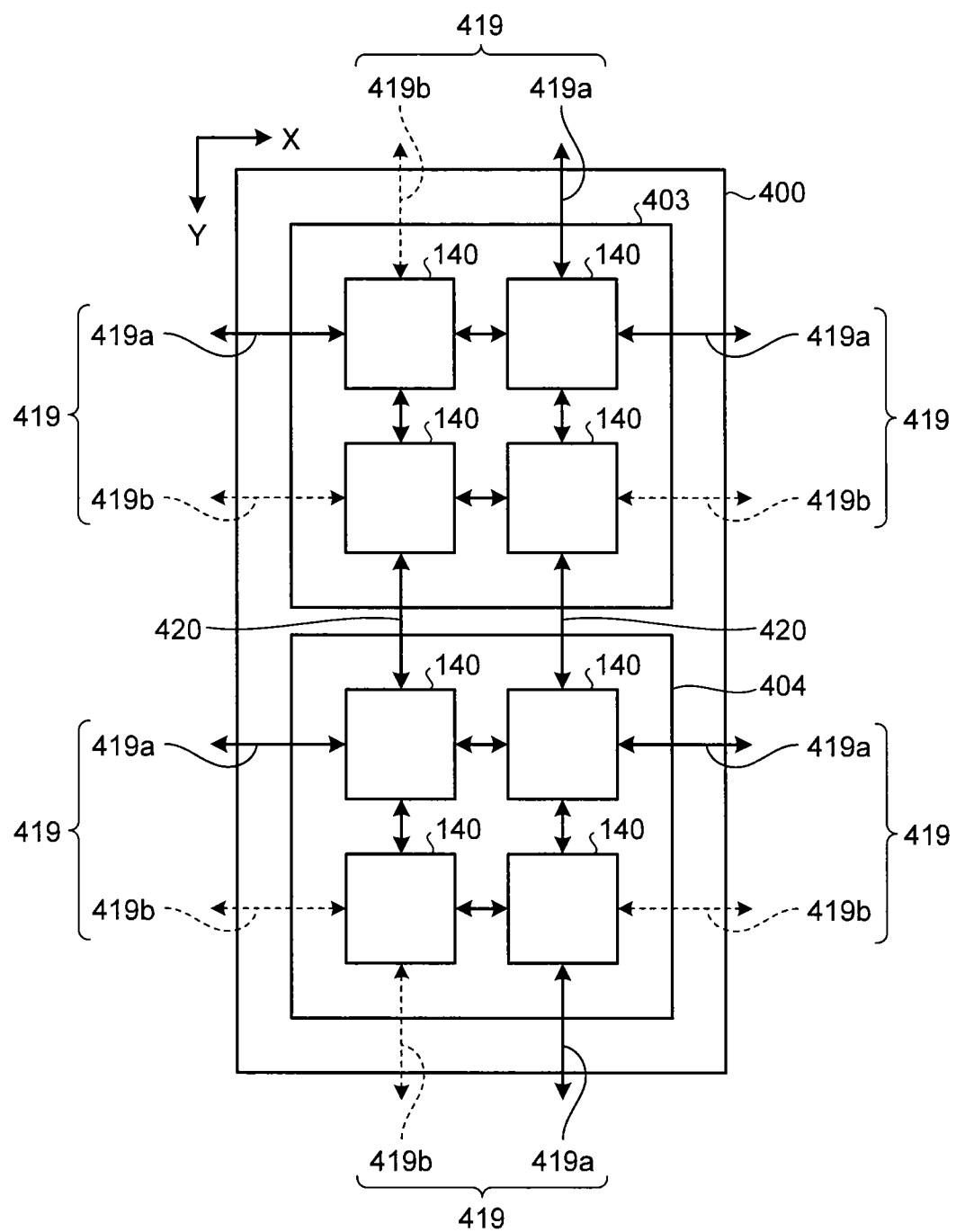
FIG. 15 is a diagram illustrating a logical connection relationship between NCs.

FIG. 15 is a diagram illustrating a logical connection relationship between the NCs 140. Each of the NCs 140 includes a total of four interfaces. Each of the NCs 140 is connected to the other two NCs 140, which are included in the same FPGA, through two interfaces that are provided in the FPGA. Two NCs 140 among the four NCs 140, which are included in the first FPGA 403, are connected to two NCs 140 among the four NCs 140, which are included in the second FPGA 404, through the LVDS interfaces 420. Since the NCs 140 are connected to each other in this way, the eight NMs 14, which are included in the NM card 400, form a group of NMs 14 having four lines and two columns.

The other interfaces of the respective NCs 140 are interfaces (LVDS interfaces 419) that are used for connection to NCs 140 included in the FPGA of another NM card 400 (not illustrated). Each of the NCs 140, which are positioned at four corners of an array having four lines and two columns, includes two LVDS interfaces 419, and each of the NCs 140, which are positioned on an outer edge portion except for the four corners, includes one LVDS interface 419. That is, the NM card 400 includes a total of twelve LVDS interfaces 419.

The LVDS interfaces 419 are used for connection between the NM cards 400. The NCs 140, which are positioned on the positive side in an X direction ("X+" direction), can be connected to NCs 140 of another NM card 400 that is mounted so as to be logically adjacent to the NM card in the "X+" direction. The NCs 140, which are positioned on the negative side in the X direction ("X−" direction), can be connected to NCs 140 of another NM card 400 that is mounted so as to be logically adjacent to the NM card in the "X−" direction. The NCs 140, which are positioned on the positive side in a Y direction ("Y+" direction), can be connected to NCs 140 of another NM card 400 that is mounted so as to be logically adjacent to the NM card in the "Y+" direction. The NCs 140, which are positioned on the negative side in the Y direction ("Y−" direction), can be connected to NCs 140 of another NM card 400 that is mounted so as to be logically adjacent to the NM card in the "Y−" direction.

A total of twelve LVDS interfaces 419 of the NM card 400 will be classified into two groups, that is, an odd group and an even group and described in this embodiment. The LVDS interfaces 419 classified into the odd group are represented as LVDS interfaces 419a, and the LVDS interfaces 419 classified into the even group are represented as LVDS interfaces 419b. Here, the twelve LVDS interfaces 419 are classified so that the number of LVDS interfaces of the odd group is the same as that of the even group in the "X+" direction, the "X−" direction, the "Y+" direction, and the "Y−" direction. In FIG. 15, a solid line indicates the LVDS interface 419a belonging to the odd group and a dotted line indicates the LVDS interface 419b belonging to the even group.

Figure 16:
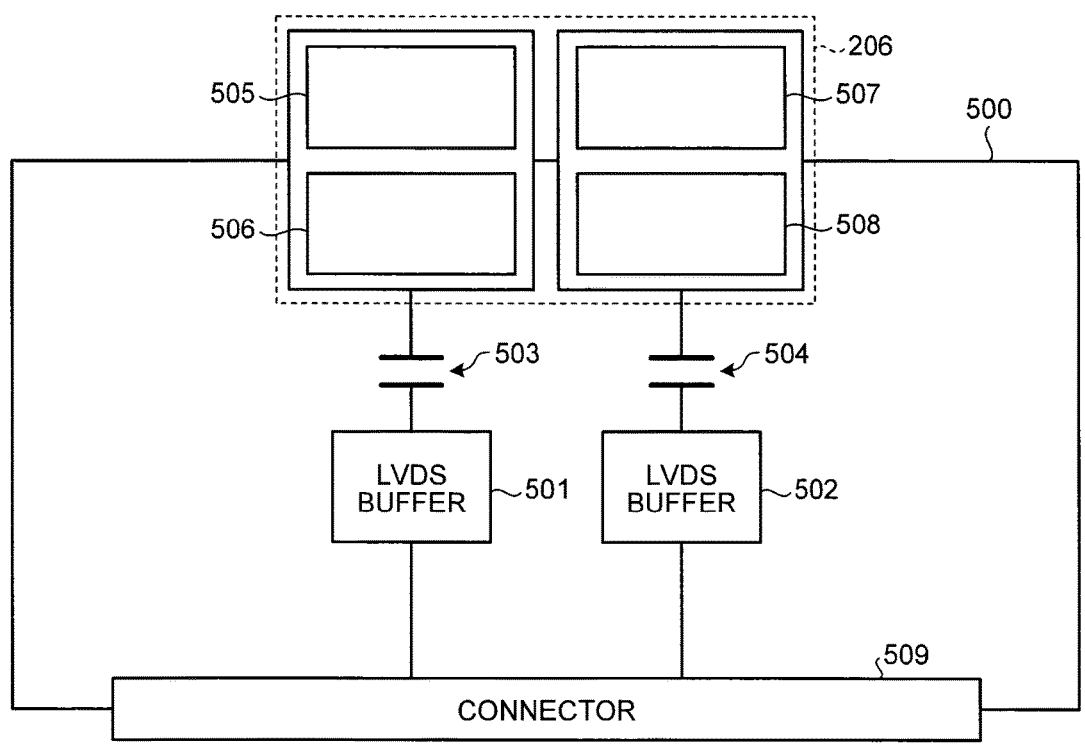
FIG. 16 is a block diagram illustrating the configuration of an I/F card.

FIG. 16 is a block diagram illustrating the configuration of the I/F card 500. The I/F card 500 includes LVDS buffers 501 and 502, capacitors 503 and 504, the connector 206, and a connector 509.

The connector 509 is a connection mechanism that is physically and electrically connected to the slot formed in the backplane 300. The I/F card 500 can communicate with the NM card 400 through the connector 509 and wiring formed on the backplane 300.

The connector 206 includes four connectors 505 to 508. Meanwhile, the connectors 505 and 506 include attachment/detachment mechanisms that can be attached and detached at the same time, and the connectors 507 and 508 include attachment/detachment mechanisms that can be attached and detached at the same time. The connector 505 is a LVDS cable connector in which terminals of the LVDS interfaces 419 corresponding to the "X+" direction are collected. The connector 506 is a LVDS cable connector in which terminals of the LVDS interfaces 419 corresponding to the "X−" direction are collected. The connector 507 is a LVDS cable connector in which terminals of the LVDS interfaces 419 corresponding to the "Y+" direction are collected. The connector 508 is a LVDS cable connector in which terminals of the LVDS interfaces 419 corresponding to the "Y−" direction are collected.

The LVDS interfaces 419 corresponding to the "X+" direction and the LVDS interfaces 419 corresponding to the "X−" direction are connected to the connectors 505 and 506 through the connector 509, the LVDS buffer 501, and the capacitor 503, respectively. The LVDS interfaces 419 corresponding to the "Y+" direction and the LVDS interfaces 419 corresponding to the "Y−" direction are connected to the connectors 507 and 508 through the connector 509, the LVDS buffer 502, and the capacitor 504, respectively.

Meanwhile, two I/F cards 500 are mounted on the backplane 300 as described above. One of the two I/F cards 500 mounted on the backplane 300 corresponds to the collection of only odd groups, and the other thereof corresponds to the collection of only even groups.

Figure 17:
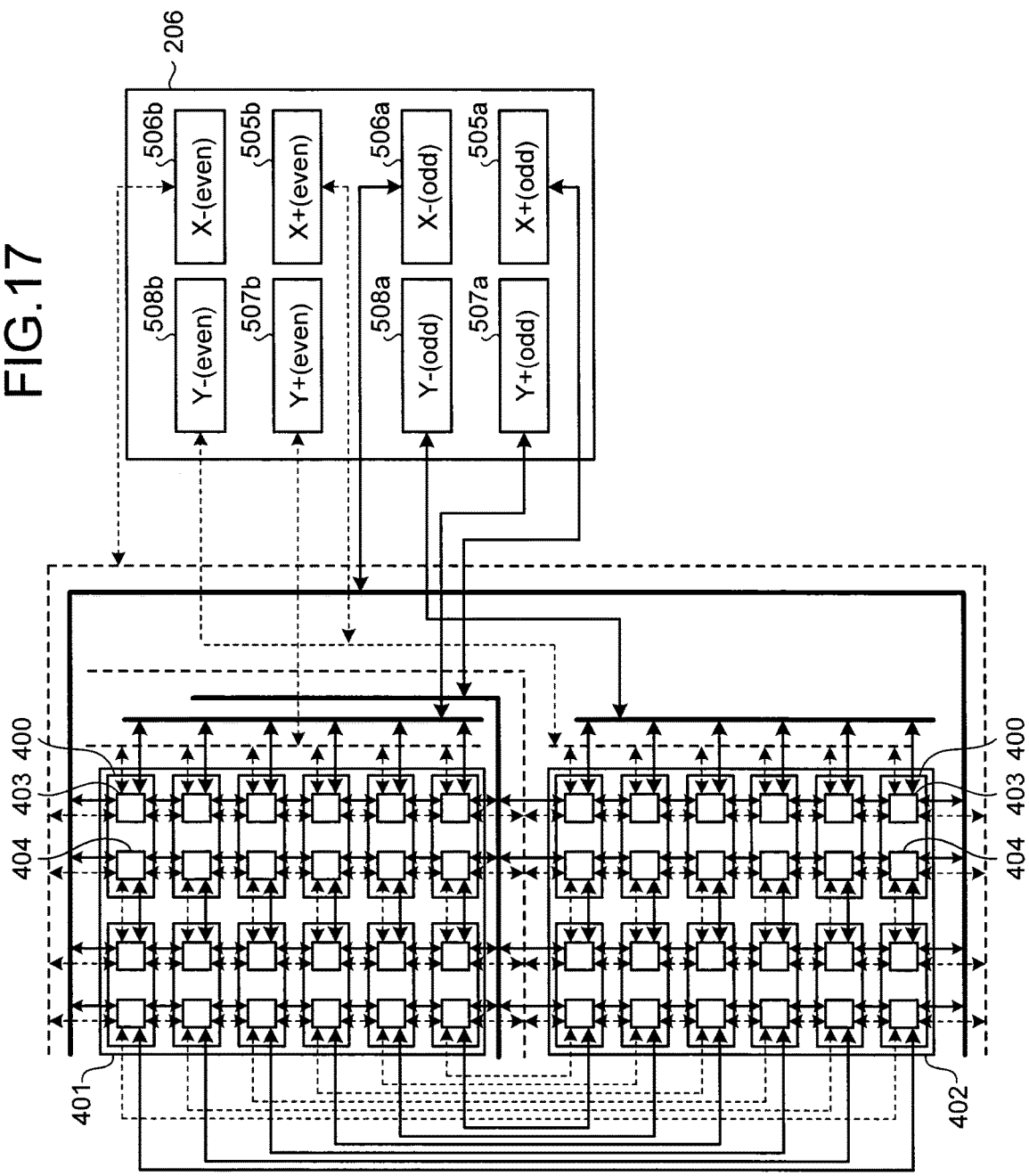
FIG. 17 is a diagram illustrating a connection relationship between the NM card and the I/F cards.

FIG. 17 is a diagram illustrating a connection relationship between the NM card 400 and the I/F card 500. Here, alphabet "a" is added to the end of reference numeral of the connector corresponding to the odd group and alphabet "b" is added to the end of reference numeral of the connector corresponding to the even group for the distinction between both the connectors.

As illustrated in FIG. 17, in the each of the first and second blocks 401 and 402, two NM cards 400, which are physically adjacent to each other in the horizontal direction in the plane of paper, are connected to each other through two LVDS interfaces 419a and two LVDS interfaces 419b. Further, in each of the first and second blocks 401 and 402, two NM cards 400, which are physically adjacent to each other in the vertical direction in the plane of paper, are connected to each other through one LVDS interface 419a and one LVDS interface 419b.

The NM cards 400, which are mounted at the lower end of the first block 401, are connected to the NM cards 400, which are mounted at the lower end of the second block 402, through one LVDS interface 419a and one LVDS interface 419b with a one-to-one relationship. The NM card 400, which is mounted at the lower end of the first block 401 at i-th from the left side in the plane of paper, is connected to the NM card 400, which is mounted at the lower end of the second block 402 at i-th from the right side in the plane of paper, with a one-to-one relationship. Since the NM cards are physically connected as described above, the definition of the X direction and the definition of the Y direction are logically different in the first and second blocks 401 and 402. In the first block 401, the right direction in the plane of paper corresponds to the "X+" direction. In the second block 402, the left direction in the plane of paper corresponds to the "X+" direction. In the first block 401, the upward direction in the plane of paper corresponds to the "Y+" direction. In the second block 402, the downward direction in the plane of paper corresponds to the "Y+" direction.

Among the LVDS interfaces 419, which correspond to the "X+" direction, of the NM cards 400 mounted at the right end of the first block 401 and the NM cards 400 mounted at the left end of the second block 402, the LVDS interfaces 419a belonging to the odd group are connected to a connector 505a. Among the LVDS interfaces 419, which correspond to the "X+" direction, of the NM cards 400 mounted at the right end of the first block 401 and the NM cards 400 mounted at the left end of the second block 402, the LVDS interfaces 419b belonging to the even group are connected to a connector 505b.

Among the LVDS interfaces 419, which correspond to the "X−" direction, of the NM cards 400 mounted at the left end of the first block 401 and the NM cards 400 mounted at the right end of the second block 402, the LVDS interfaces 419a belonging to the odd group are connected to a connector 506a. Among the LVDS interfaces 419, which correspond to the "X−" direction, of the NM cards 400 mounted at the left end of the first block 401 and the NM cards 400 mounted at the right end of the second block 402, the LVDS interfaces 419b belonging to the even group are connected to a connector 506b.

Among the LVDS interfaces 419, which correspond to the "Y+" direction, of the NM cards 400 mounted at the upper end of the first block 401, the LVDS interfaces 419a belonging to the odd group are connected to a connector 507a. Among the LVDS interfaces 419, which correspond to the "Y+" direction, of the NM cards 400 mounted at the upper end of the first block 401, the LVDS interfaces 419b belonging to the even group are connected to a connector 507b.

Among the LVDS interfaces 419, which correspond to the "Y–" direction, of the NM cards 400 mounted at the upper end of the second block 402, the LVDS interfaces 419a belonging to the odd group are connected to a connector 508a. Among the LVDS interfaces 419, which correspond to the "Y–" direction, of the NM cards 400 mounted at the upper end of the second block 402, the LVDS interfaces 419b belonging to the even group are connected to a connector 508b.

Figure 18:
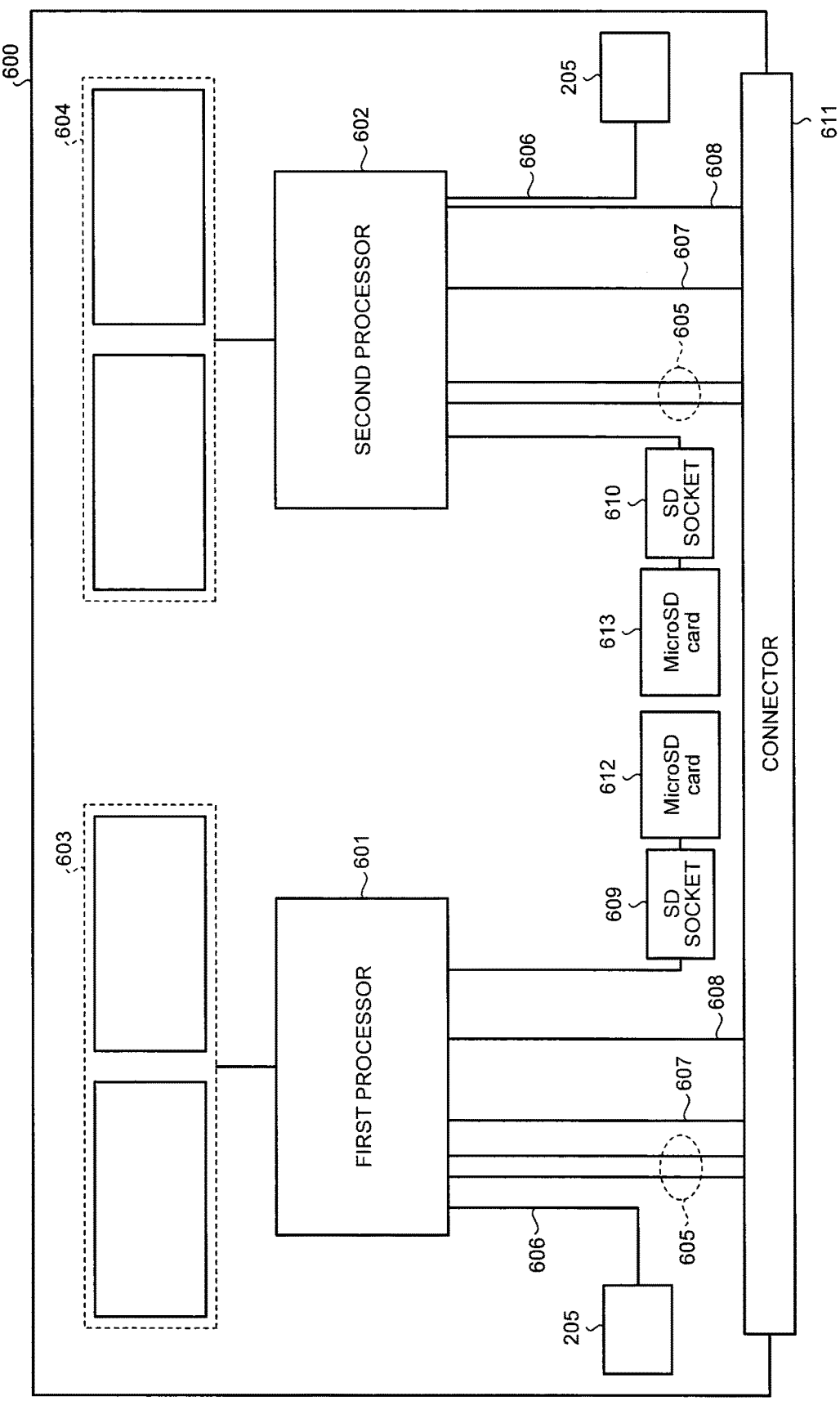
FIG. 18 is a block diagram illustrating the configuration of a CU card of the first embodiment.

FIG. 18 is a block diagram illustrating the configuration of the CU card 600. The CU card 600 includes a first processor 601, a second processor 602, a DRAM 603, a DRAM 604, the two connectors 205, an SD socket 609, an SD socket 610, and a connector 611.

The connector 611 is a connection mechanism that is physically and electrically connected to the slot formed in the backplane 300. The CU card 600 can communicate with the other cards through the connector 611 and wiring formed on the backplane 300.

Each of the first processor 601 and the second processor 602 functions as an individual CU 11 by executing a program. That is, the CU card 600 corresponds to two CUs 11. The first processor 601 is connected to the DRAM 603, and can use the DRAM 603 as a work area. The first processor 601 is connected to the SD socket 609. A MicroSD card 612 in which the program executed by the first processor 601 is stored in advance is connected to the SD socket 609. The second processor 602 is connected to the DRAM 604, and can use the DRAM 604 as a work area. The second processor 602 is connected to the SD socket 610. A MicroSD card 613 in which the program executed by the second processor 602 is stored in advance is connected to the SD socket 610.

The first processor 601 is connected to one of the two connectors 205 through an interface 606 that complies with an Ethernet standard. Further, the first processor 601 is connected to the connector 611 through two PCIe interfaces 605. Furthermore, the first processor 601 is connected to the connector 611 through one interface 607 that complies with an Ethernet standard. Moreover, the first processor 601 is connected to the connector 611 through one I2C interface 608.

Likewise, the second processor 602 is connected to one of the two connectors 205 through an interface 606 that complies with an Ethernet standard. Further, the second processor 602 is connected to the connector 611 through two PCIe interfaces 605. Furthermore, the second processor 602 is connected to the connector 611 through one interface 607 that complies with an Ethernet standard. Moreover, the second processor 602 is connected to the connector 611 through one I2C interface 608.

Figure 19:
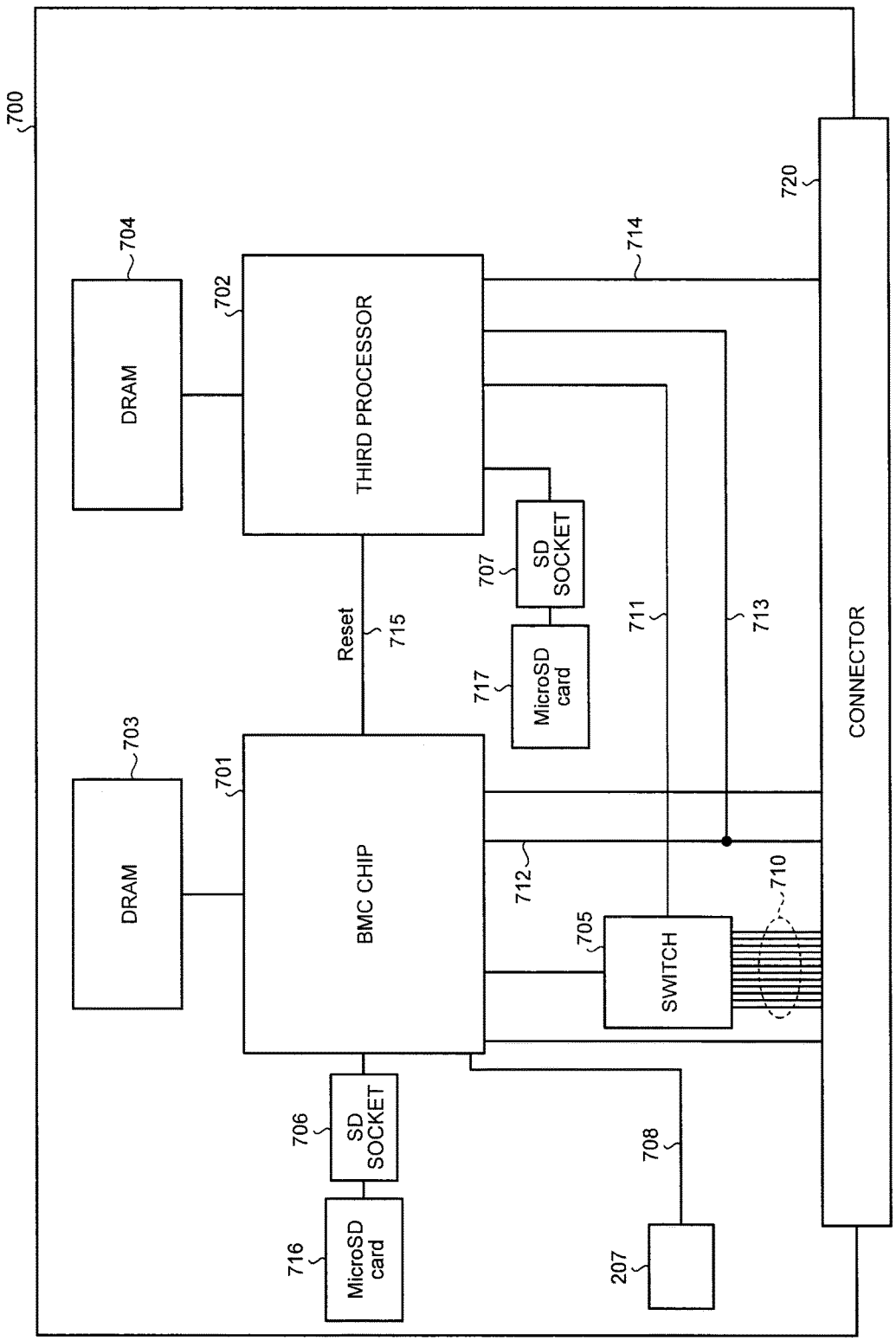
FIG. 19 is a block diagram illustrating the configuration of a MM card.

FIG. 19 is a block diagram illustrating the configuration of the MM card 700. The MM card 700 includes a BMC chip 701, a third processor 702, a DRAM 703, a DRAM 704, a switch 705, the connector 207, an SD socket 706, an SD socket 707, and the connector 720.

The connector 720 is a connection mechanism that is physically and electrically connected to the slot formed in the backplane 300. The MM card 700 can communicate with the other cards through the connector 720 and wiring formed on the backplane 300.

The BMC chip 701 is a chip that realizes the function of BMC. The BMC chip 701 is connected to the DRAM 703, and uses the DRAM 703 as a work area. The BMC chip 701 is connected to the SD socket 706. The BMC chip 701 can record various pieces of monitoring data on a MicroSD card 716 connected to the SD socket 706. The BMC chip 701 is connected to the connector 207 through an interface 708 that complies with an Ethernet standard, and can communicate with the outside through the connector 207.

The third processor 702 can perform NM control processing on the memory unit 10 on the basis of a program. The third processor 702 is connected to the DRAM 704, and can use the DRAM 704 as a work area. The third processor 702 is connected to the SD socket 707. A MicroSD card 717 in which the program executed by the third processor 702 is stored in advance is connected to the SD socket 707.

The switch 705 is connected to the connector 720 through twelve interfaces 710 between the connector 720 and itself, is connected to the third processor 702 through one interface 711 between the third processor 702 and itself, and is connected to the BMC chip 701 through one interface between the BMC chip 701 and itself. The respective interfaces connected to the switch 705 comply with an Ethernet standard. The twelve interfaces 710 are connected to the respective processors (the first and second processors 601 and 602), which are mounted on the CU card 600, through the connector 720 and the backplane 300. The switch 705 relays communication between the first and second processors 601 and 602 and the third processor 702 and the BMC chip 701. The BMC chip 701 can acquire information, which is generated by the respective processors, through the switch 705.

Further, the BMC chip 701 is connected to the connector 720 through an I2C interface 712 between the connector 720 and itself. The I2C interface 712 branches to the I2C interface 713 midway at the midway thereof, and the I2C interface 713 is connected to the third processor 702. A terminal of the I2C interface 712 corresponding to the connector 720 is connected to the first and second processors 601 and 602 and the first and second FPGAs 403 and 404 through the backplane 300 and the connectors of the various cards. The BMC chip 701 monitors the first and second processors 601 and 602 and the first and second FPGAs 403 and 404 through the I2C interface 712. Monitoring data, which is sent from the first and second processors 601 and 602 and the first and second FPGAs 403 and 404, are also referred by the third processor 702 through the I2C interface 713. The third processor 702 can perform NM control processing by using monitoring data.

The third processor 702 is connected to the connector 720 through a PCIe interface 714. A terminal of the PCIe interface 714 corresponding to the connector 720 is connected to one NM card 400 through the backplane 300. The third processor 702 can send a packet, which is for an arbitrary NC 140, to the PCIe interface 714, or can receive a packet, which is obtained from an arbitrary NC 140, through the PCIe interface 714.

Figure 20:
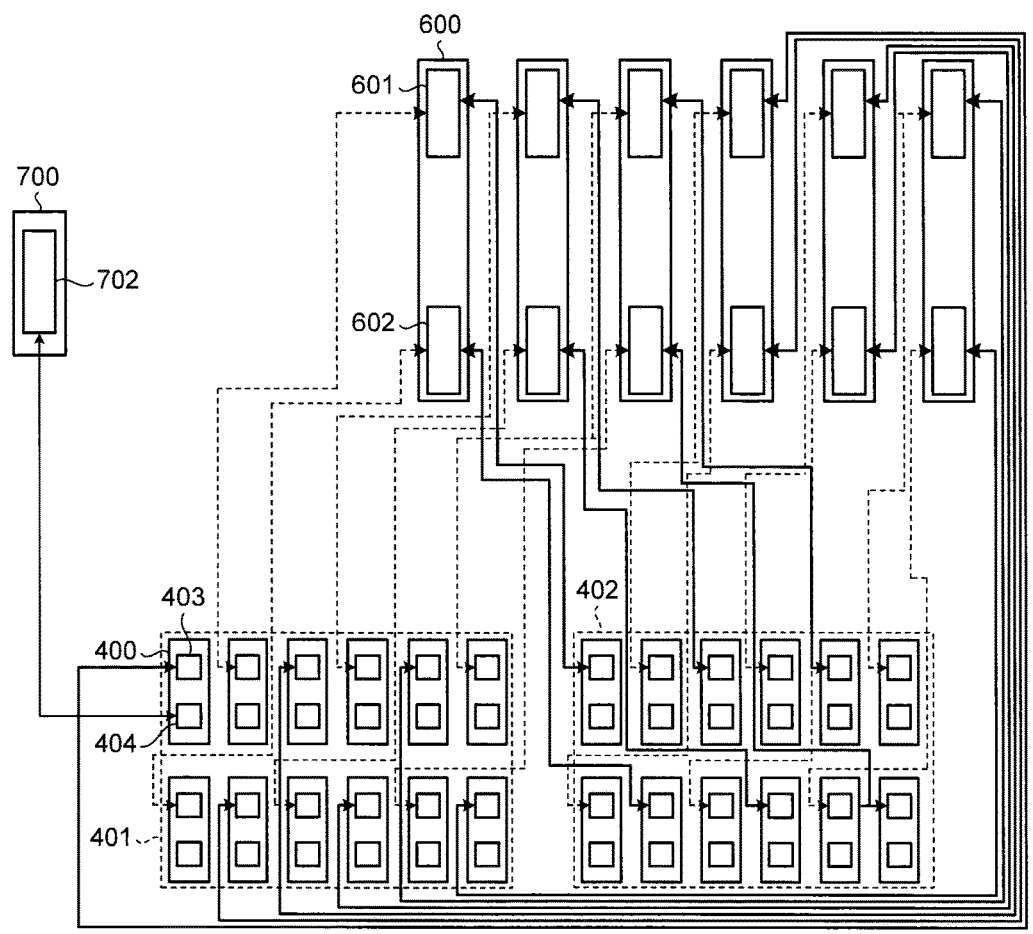
FIG. 20 is a diagram illustrating a connection relationship among the NM cards, the CU cards, and the MM card.

FIG. 20 is a diagram illustrating a connection relationship among the NM cards 400, the CU cards 600, and the MM card 700. All connections illustrated in FIG. 20 are connections using a PCIe interface. Further, the connection relationship illustrated in FIG. 20 is realized by wiring that is formed in the respective cards and wiring that is formed in the backplane 300.

As described above, each CU card 600 includes four PCIe interfaces 605 and each NM card 400 includes two PCIe interfaces 418. Since the four PCIe interfaces 605 are used for connection to different NM cards 400, each CU card 600 is connected to four NM cards 400. One of the two PCIe interfaces 418 of each NM card 400 is used for connection to the CU card 600. Here, the PCIe interface 418 of the first FPGA 403 is used for connection to the CU card 600.

The respective first processors 601 of three CU cards 600, which are positioned on the left side in the plane of paper, are connected to different NM cards 400 that are mounted at the upper end of the first block 401 and different NM cards 400 that are mounted at the upper end of the second block 402. Further, the respective second processors 602 of three CU cards 600, which are positioned on the left side in the plane of paper, are connected to different NM cards 400 that are mounted at the lower end of the first block 401 and different NM cards 400 that are mounted at the lower end of the second block 402.

The respective first processors 601 of three CU cards 600, which are positioned on the right side in the plane of paper, are connected to both different NM cards 400 that are mounted at the upper end of the first block 401 and different NM cards 400 that are mounted at the upper end of the second block 402. Further, the respective second processors 602 of three CU cards 600, which are positioned on the right side in the plane of paper, are connected to both different NM cards 400 that are mounted at the lower end of the first block 401 and different NM cards 400 that are mounted at the lower end of the second block 402.

In this way, each CU card 600 is connected to both the NM card 400 that belongs to the first block 401 and the NM card 400 that belongs to the second block 402. Accordingly, even when NM cards 400 are mounted on only any one of the first and second blocks 401 and 402, each CU card 600 can exhibit a function as the CU 11 for the NM card 400. Furthermore, the enclosure 200 can be operated in a state in which the CU cards 600 of which the number is an arbitrary number among 1 to 6 are mounted regardless of whether or not the NM cards 400 are mounted on both the first and second blocks 401 and 402.

Meanwhile, since the MM card 700 is connected to only one NM card 400 belonging to the first block 401 as described below, the enclosure 200 is operated in a state in which the NM card 400 is connected to at least the first block 401. When the MM card 700 is connected to an arbitrary NM card 400 belonging to the second block 402, the enclosure 200 can be operated in a state in which the NM cards 400 are mounted on only the second block 402.

The MM card 700 includes one PCIe interface 714. The MM card 700 is connected to one NM card 400 by the use of the PCIe interface 714. Here, in the NM card 400, the PCIe interface 418 of the second FPGA 404 is used for connection to the MM card 700. Further, the MM card 700 is connected to an NM card 400 that is mounted on the leftmost side of the upper end of the first block 401. The MM card 700 can send and receive a packet through the PCIe interface 714.

Figure 21:
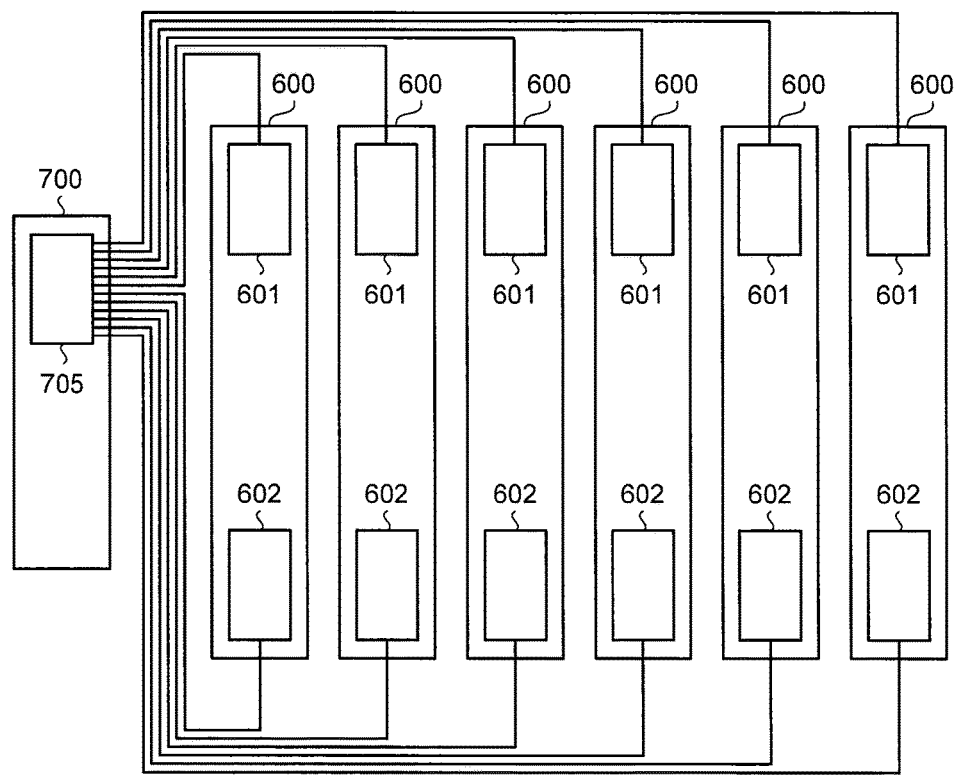
FIG. 21 is a diagram illustrating a connection relationship between the CU cards and the MM card.

FIG. 21 is a diagram illustrating a connection relationship between the CU cards 600 and the MM card 700. Here, connection using an I2C interface is not illustrated, and a connection relationship using an interface, which complies with an Ethernet standard, is illustrated. The connection relationship illustrated in FIG. 21 is realized by wiring that is formed in the respective cards and wiring that is formed in the backplane 300.

The MM card 700 includes twelve interfaces 710 that comply with an Ethernet standard. Further, each CU card 600 includes two interfaces 607 that comply with an Ethernet standard. Since two interfaces 710 are used in each CU card 600, the MM card 700 is connected to six CU cards 600.

Next, a connection example for performing the scale-out of the memory unit 10 will be described.

A connection example (first connection example) for building one memory unit 10 by using two storage systems 1, which is included in one enclosure 200, will be described. An alphabet is added to the end of reference numeral of each storage system 1 for the identification among plurality of storage systems 1.

Figure 22:
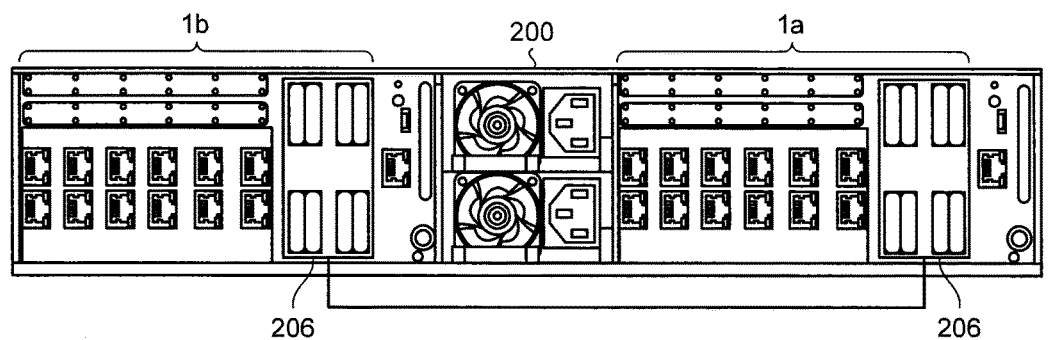
FIG. 22 is a diagram illustrating a connector group that is used in a first connection example.
Figure 23:
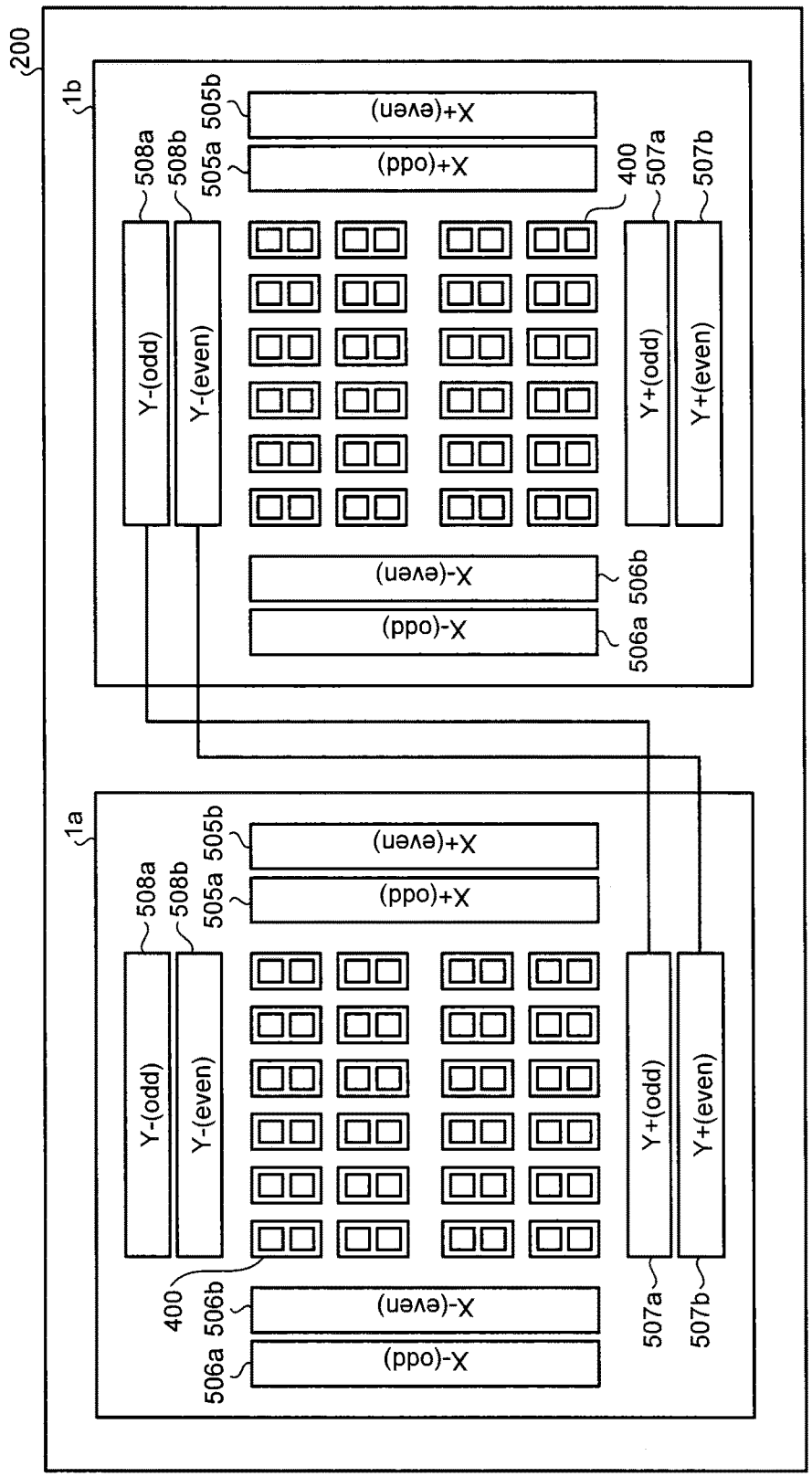
FIG. 23 is a diagram illustrating a specific connection relationship according to the first connection example.
Figure 24:
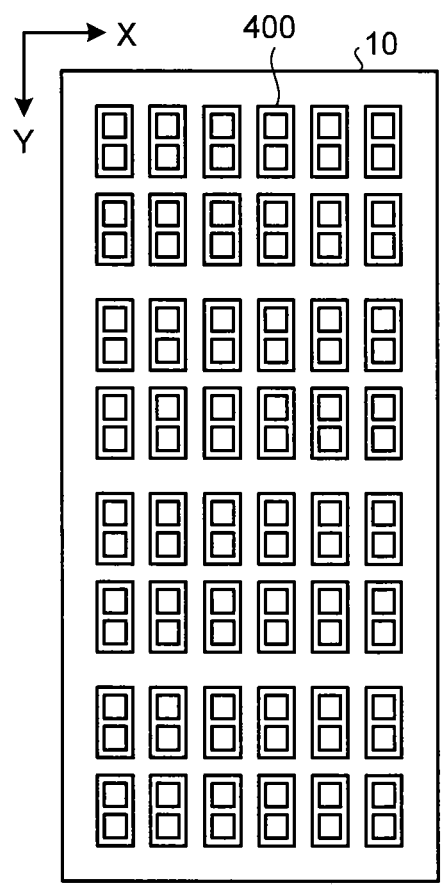
FIG. 24 is a diagram illustrating a memory unit that is logically built by the first connection example.

FIG. 22 is a diagram illustrating a connector group that is used in the first connection example. FIG. 23 is a diagram illustrating a specific connection relationship according to the first connection example. FIG. 24 is a diagram illustrating the memory unit 10 that is logically built by the first connection example.

As illustrated in FIG. 22, a connector 206 of one (storage system 1a) of two storage systems 1 that is included in one enclosure 200 and a connector 206 of the other (storage system 1b) thereof are connected to each other in the first connection example. Specifically, a connector 507a of the storage system 1a and a connector 508a of the storage system 1b are connected to each other as illustrated in FIG. 23. Further, a connector 507b of the storage system 1a and a connector 508b of the storage system 1b are connected to each other. A memory unit 10 of the storage system 1b is connected in the "Y+" direction of a memory unit 10 of the storage system 1a by the connection of these connectors. That is, the memory units 10 of the respective storage systems 1a and 1b are united, so that a new memory unit 10 illustrated in FIG. 24 is logically formed. The new memory unit 10 has a configuration in which six NM cards 400 are arranged in the X direction and eight NM cards 400 are arranged in the Y direction.

Figure 25:
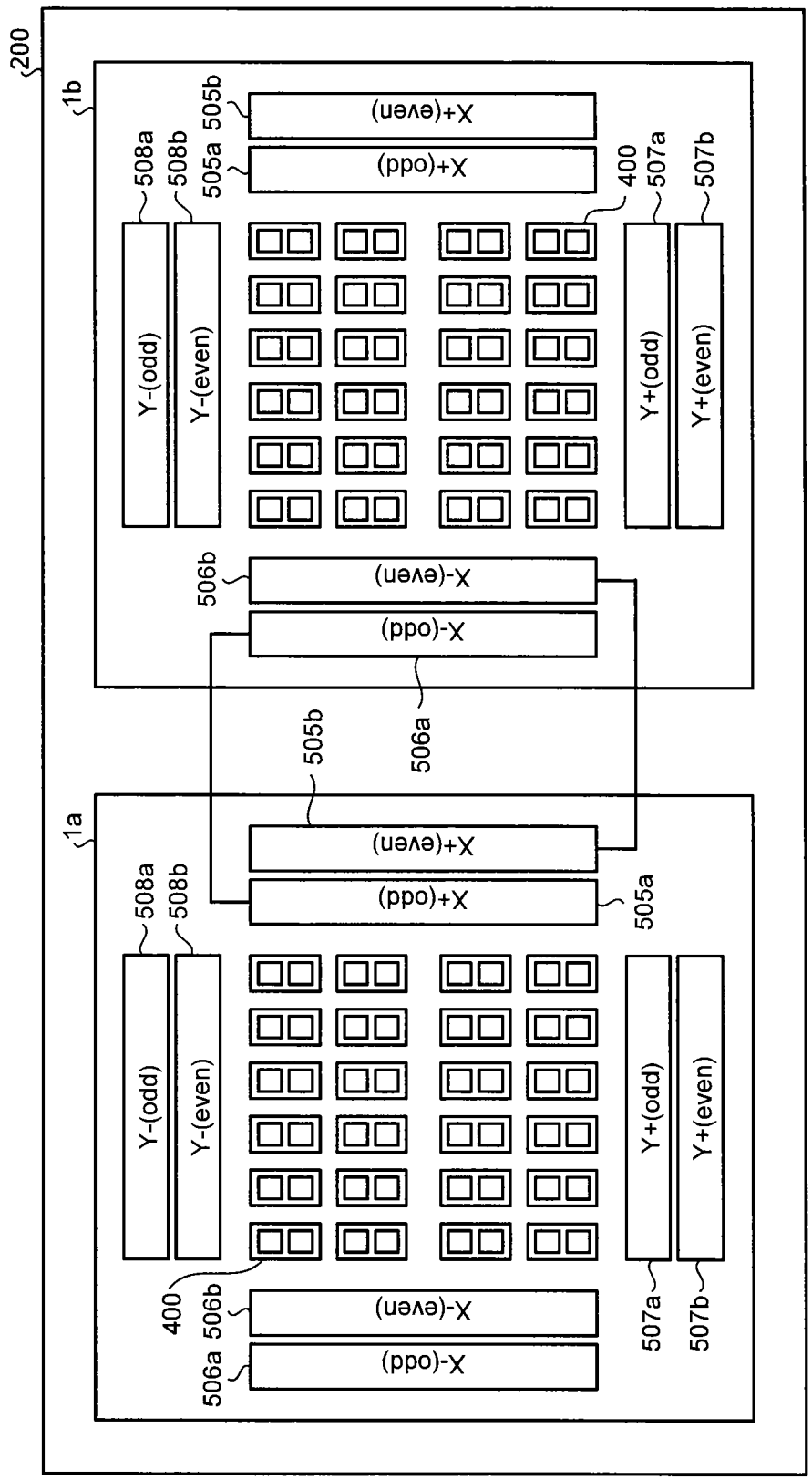
FIG. 25 is a diagram illustrating a specific connection relationship according to a second connection example.
Figure 26:
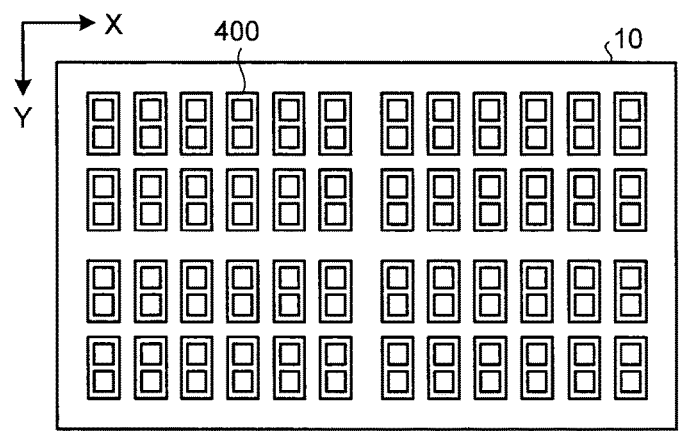
FIG. 26 is a diagram illustrating a memory unit that is logically built by the second connection example.

Two memory units 10 are connected to each other in the Y direction in the first connection example, but two memory units 10 can be connected to each other in the X direction. FIG. 25 is a diagram illustrating a specific connection relationship according to a second connection example. FIG. 26 is a diagram illustrating a memory unit 10 that is logically built by the second connection example.

As illustrated in FIG. 25, a connector 505a of the storage system 1a and a connector 506a of the storage system 1b are connected to each other in the second connection example. Further, a connector 505b of the storage system 1a and a connector 506b of the storage system 1b are connected to each other. The memory unit 10 of the storage system 1b is connected in the "X+" direction of the memory unit 10 of the storage system 1a by the connection of these connectors. That is, the memory units 10 of the respective storage systems 1a and 1b are united, so that a new memory unit 10 having a configuration in which twelve NM cards 400 are arranged in the X direction and four NM cards 400 are arranged in the Y direction is logically built as illustrated in FIG. 26.

It is possible to expand the scale of the memory unit 10 in the X direction by connecting the connector 505 of one storage system 1a, which corresponds to the "X+" direction, to the connector 506 of the storage system 1b, which corresponds to the "X−" direction, in this way. Further, it is possible to expand the scale of the memory unit 10 in the Y direction by connecting the connector 507 of one storage system 1*a*, which corresponds to the "Y+" direction, to the connector 508 of the storage system 1*b* that corresponds to the "Y−" direction.

Furthermore, it is possible to expand the memory unit 10 by using a plurality of enclosures 200. A third connection example, which is a connection example for building one memory unit 10 by using a total of four storage systems 1 that are included in two enclosures 200, will be described. Different alphabets are added to the ends of reference numerals of the two enclosures 200 for the identification between the two enclosures 200.

Figure 27:
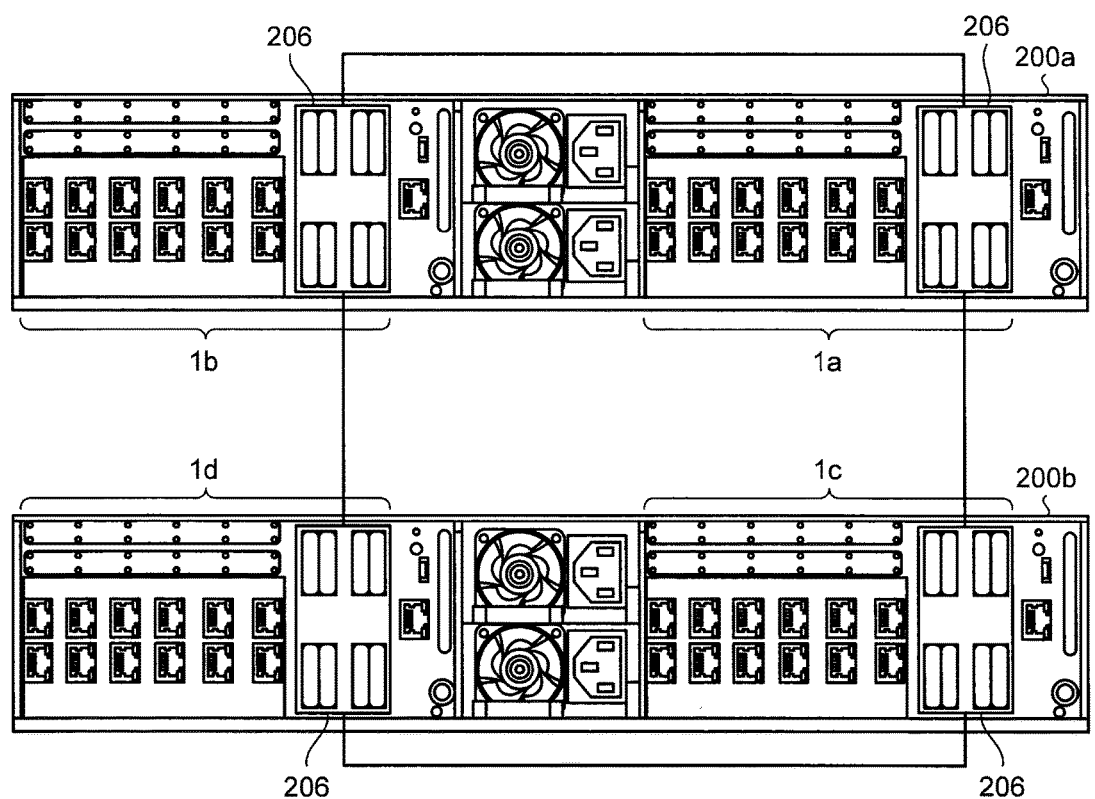
FIG. 27 is a diagram illustrating a connector group that is used in a third connection example.
Figure 28:
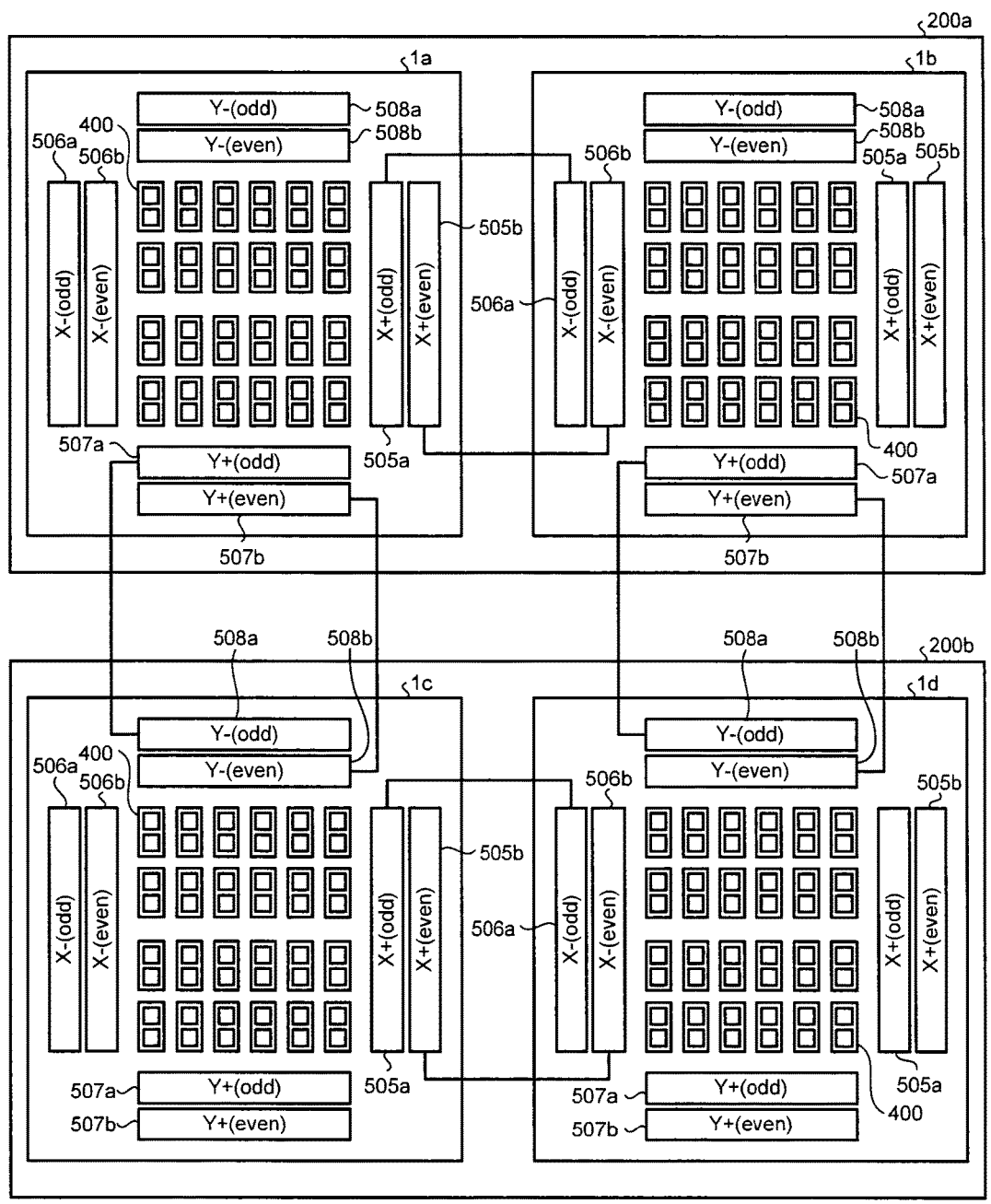
FIG. 28 is a diagram illustrating a specific connection relationship according to the third connection example.
Figure 29:
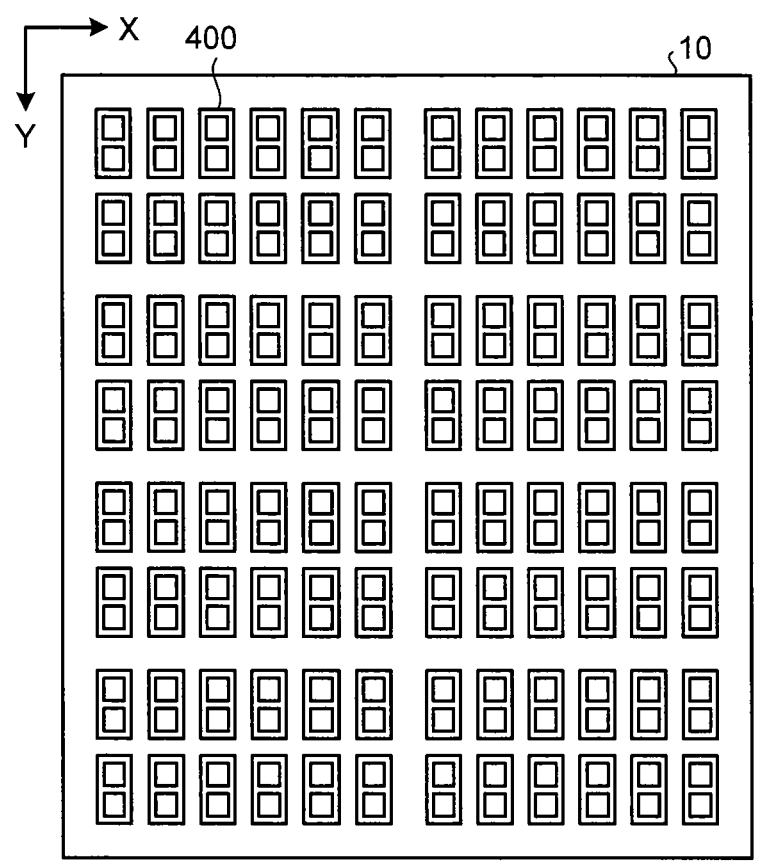
FIG. 29 is a diagram illustrating a memory unit that is logically built by the third connection example.

FIG. 27 is a diagram illustrating a connector group that is used in the third connection example. FIG. 28 is a diagram illustrating a specific connection relationship according to the third connection example. FIG. 29 is a diagram illustrating a memory unit 10 that is logically built by the third connection example.

As illustrated in FIG. 27, storage systems 1*a* and 1*b*, which are included in one enclosure 200 (enclosure 200*a*), are connected to storage systems 1*c* and 1*d*, which are included in the other enclosure 200 (enclosure 200*b*), through connectors 206 in the third connection example. In more detail, the storage systems 1*a* and 1*d* are connected to the storage systems 1*b* and 1*c*.

The connectors are connected to each other as illustrated in FIG. 28. That is, a connector 505*a* of the storage system 1*a* and a connector 506*a* of the storage system 1*b* are connected to each other. Further, a connector 505*b* of the storage system 1*a* and a connector 506*b* of the storage system 1*b* are connected to each other. Furthermore, a connector 507*a* of the storage system 1*a* and a connector 508*a* of the storage system 1*c* are connected to each other. Moreover, a connector 507*b* of the storage system 1*a* and a connector 508*b* of the storage system 1*c* are connected to each other. Further, a connector 505*a* of the storage system 1*c* and a connector 506*a* of the storage system 1*d* are connected to each other. Furthermore, a connector 505*b* of the storage system 1*c* and a connector 506*b* of the storage system 1*b* are connected to each other. Moreover, a connector 507*a* of the storage system 1*b* and a connector 508*a* of the storage system 1*d* are connected to each other. Further, a connector 507*b* of the storage system 1*b* and a connector 508*b* of the storage system 1*d* are connected to each other.

Memory units 10 of the storage systems 1*a* to 1*d* are united, so that a new memory unit 10 having a configuration in which twelve NM cards 400 are arranged in the X direction and eight NM cards 400 are arranged in the Y direction is logically built as illustrated in FIG. 29.

It is possible to expand the scale of the memory unit 10 both in the X direction and in the Y direction by using a plurality of enclosures 200. Meanwhile, it is also possible to expand the scale of the memory unit 10 only in the X direction by using the storage systems 1*a* to 1*d*. Further, it is also possible to expand the scale of the memory unit 10 only in the Y direction by using the storage systems 1*a* to 1*d*. Meanwhile, an example in which the scale of the memory unit 10 is expanded by using two enclosures 200 is illustrated here, but the scale of the memory unit 10 can also be expanded by using three or more enclosures 200.

Figure 30:
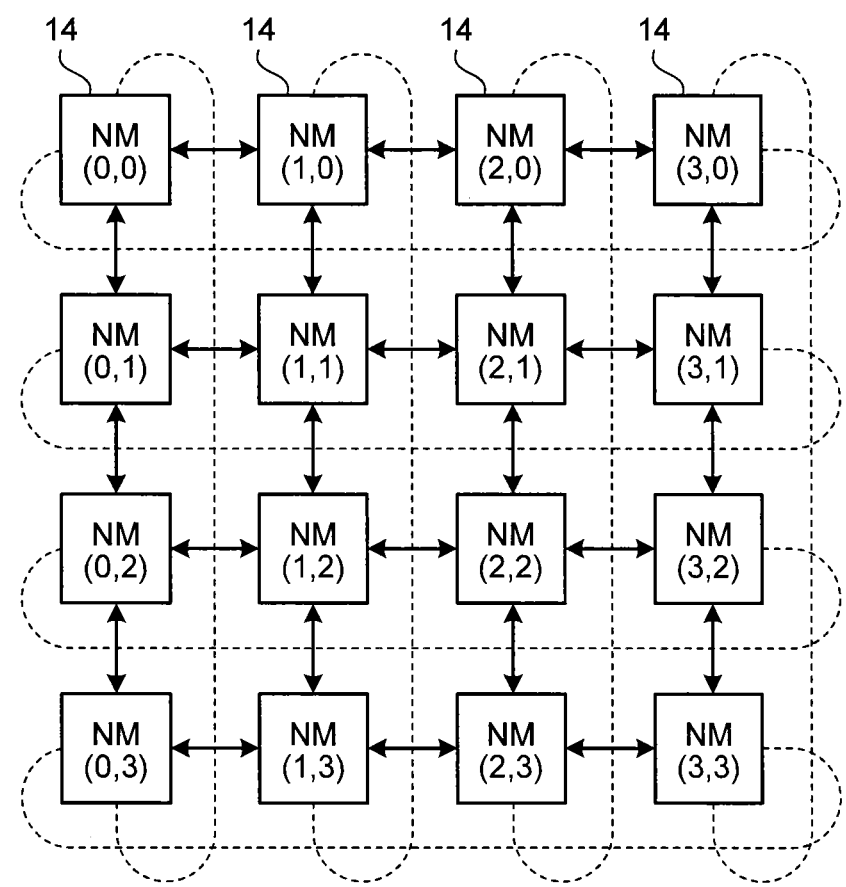
FIG. 30 is a diagram illustrating a torus-shaped connection relationship.

When NMs 14 are two-dimensionally arranged, the NMs 14 may be connected in a torus shape by the connection between NMs 14 that are positioned on sides facing each other. FIG. 30 is a diagram illustrating a torus-shaped connection relationship. In an example illustrated in FIG. 30, NMs 14 are connected to each other by wiring that is illustrated by a solid line and wiring that is illustrated by a dotted line. The wiring illustrated by a dotted line is equivalent to the wiring illustrated by a solid line. In this case, it is possible to perform routing in a plurality of directions according to whether to perform routing in a direction in which the X-coordinate value of a node address increases or to perform routing in a direction in which the X-coordinate value of a node address decreases, and/or whether to perform routing in a direction in which the Y-coordinate value of a node address increases or to perform routing in a direction in which the Y-coordinate value of a node address decreases. For example, a packet of which a transmission source is a node (2,0) and a transmission destination is a memory node (2,2) is transmitted to NMs 14 of which node addresses are, for example, (2,0), (2,1), and (2,2) in this order when routing is performed in a direction in which a Y-coordinate value increases. Further, this packet is transmitted to NMs 14 of which node addresses are, for example, (2,0), (2,3), and (2,2) in this order when routing is performed in a direction in which a Y-coordinate value decreases. Since a path up to the transmission destination increases in this way when a plurality of NMs 14 forming a memory unit 10 is connected in a torus shape, the throughput of the entire storage system 1 is improved. An example of connection between connectors for realizing torus-shaped connection will be described below.

Figure 31:
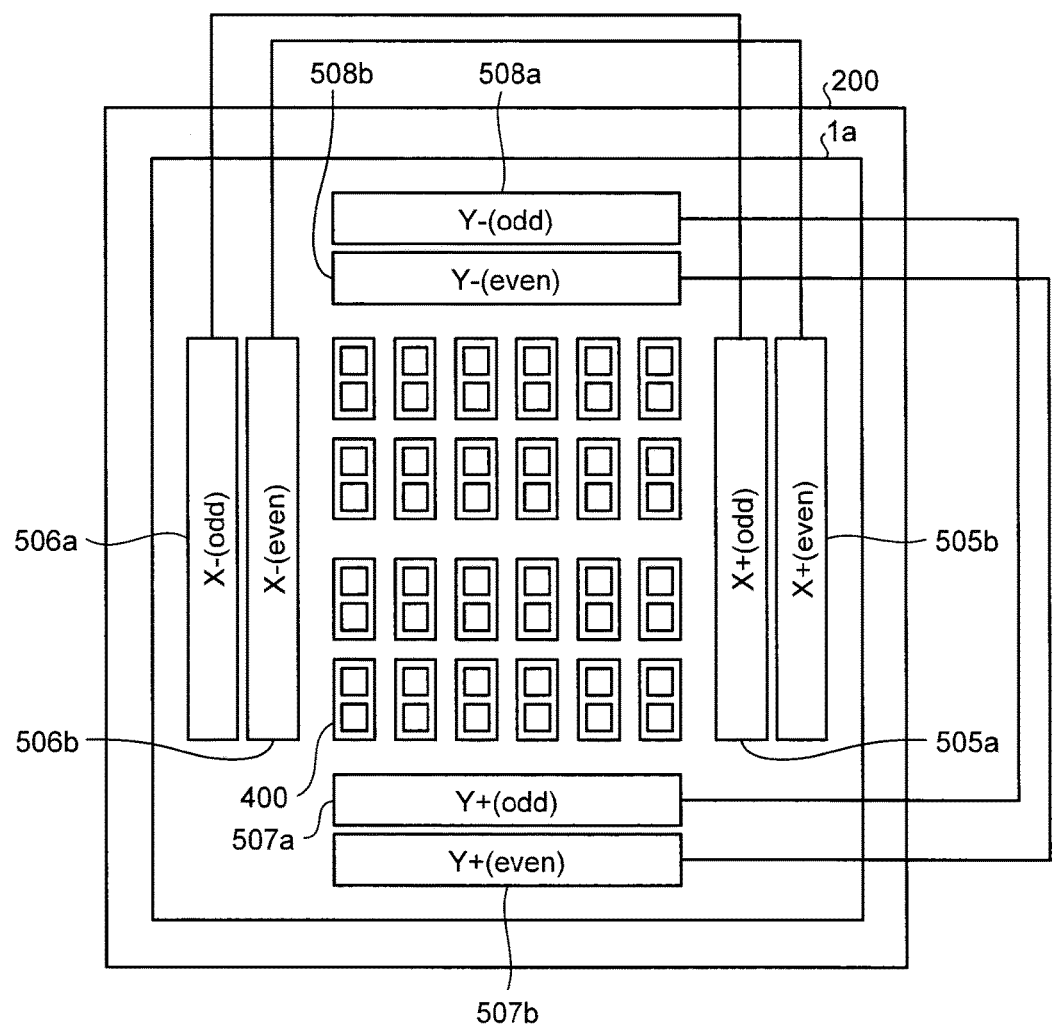
FIG. 31 is a diagram illustrating a specific connection relationship according to a fourth connection example.

FIG. 31 is a diagram illustrating a specific connection relationship according to a fourth connection example. The fourth connection example is a connection example that realizes torus-shaped connection by only one storage system 1*a*. As illustrated in FIG. 31, a connector 505*a* and a connector 506*a* are connected to each other. Further, a connector 505*b* and a connector 506*b* are connected to each other. Furthermore, a connector 507*a* and a connector 508*a* are connected to each other. Moreover, a connector 507*b* and a connector 508*b* are connected to each other. Accordingly, torus-shaped connection is realized by only a memory unit 10 of one storage system 1*a*.

Figure 32:
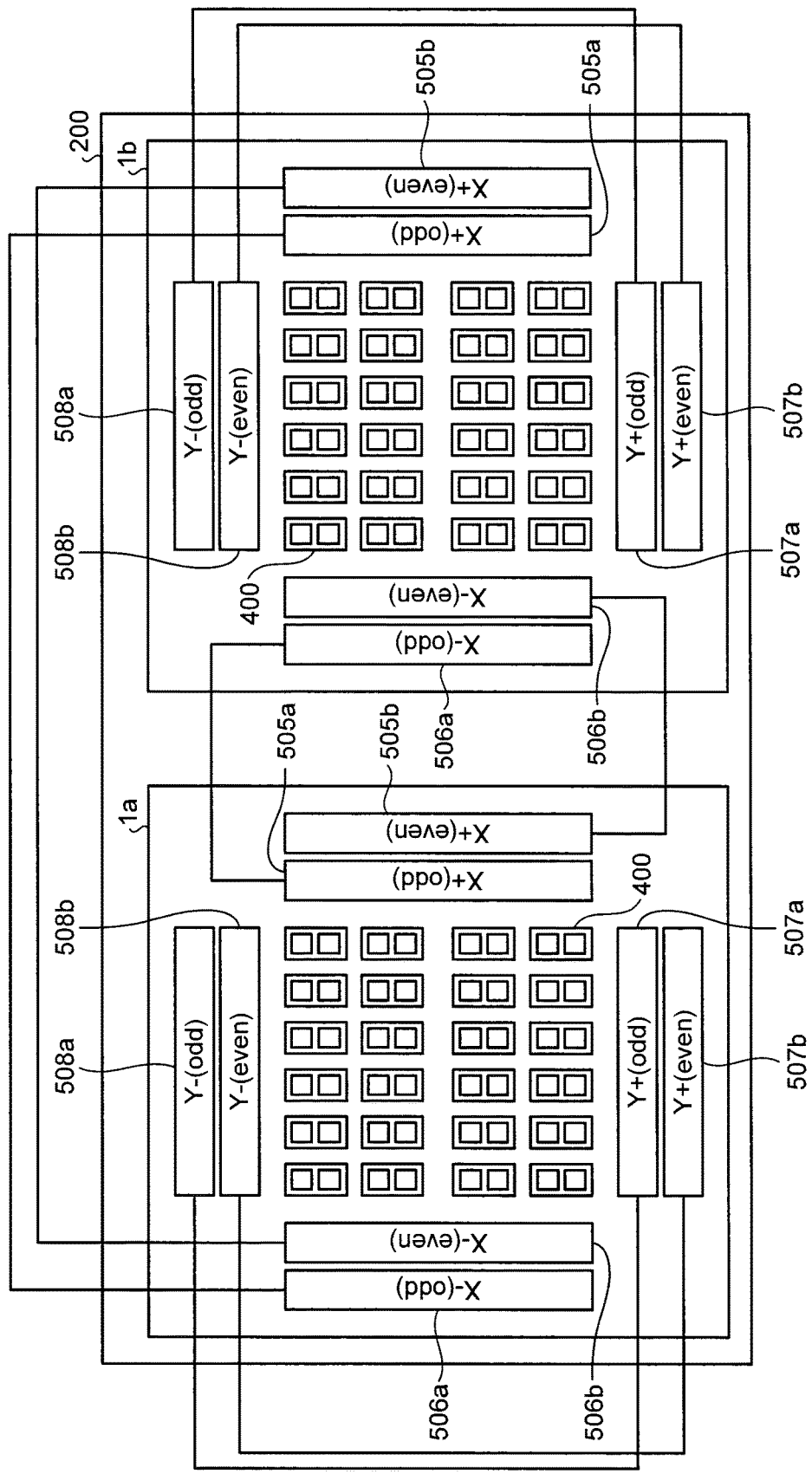
FIG. 32 is a diagram illustrating a specific connection relationship according to a fifth connection example.

FIG. 32 is a diagram illustrating a specific connection relationship according to a fifth connection example. The fifth connection example is a connection example that realizes torus-shaped connection by two storage systems 1*a* and 1*b*. The fifth connection example is realized by the following connection in addition to the same connection between connectors as that in the second connection example. That is, a connector 506*a* of the storage system 1*a* and a connector 505*a* of the storage system 1*b* are connected to each other. Further, a connector 506*b* of the storage system 1*a* and a connector 505*b* of the storage system 1*b* are connected to each other. Furthermore, in each of the storage systems 1*a* and 1*b*, a connector 507*a* and a connector 508*a* are connected to each other and a connector 507*b* and a connector 508*b* are connected to each other.

Figure 33:
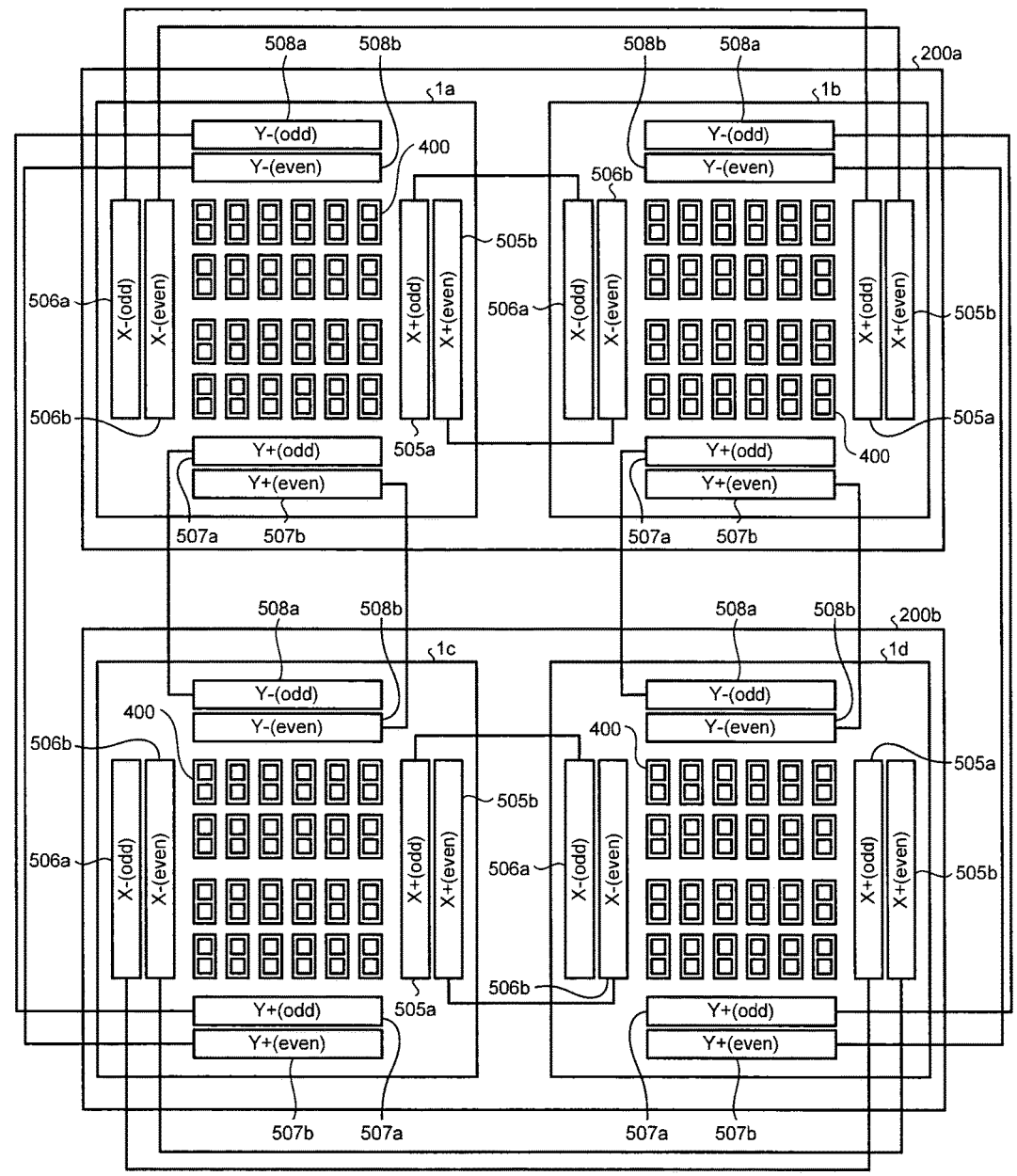
FIG. 33 is a diagram illustrating a specific connection relationship according to a sixth connection example.

FIG. 33 is a diagram illustrating a specific connection relationship according to a sixth connection example. The sixth connection example is a connection example that realizes torus-shaped connection by four storage systems 1*a*, 1*b*, 1*c*, and 1*d*. The sixth connection example is realized by the following connection in addition to the same connection between connectors as that in the third connection example. That is, a connector 506*a* of the storage system 1*a* and a connector 505*a* of the storage system 1*b* are connected to each other. Further, a connector 506*b* of the storage system 1*a* and a connector 505*b* of the storage system 1*b* are connected to each other. Furthermore, a connector 506*a* of the storage system 1*c* and a connector 505*a* of the storage system 1*d* are connected to each other. Moreover, a connector 506*b* of the storage system 1*c* and a connector 505*b* of the storage system 1*d* are connected to each other. Further, a connector 508a of the storage system 1a and a connector 507a of the storage system 1c are connected to each other. Furthermore, a connector 508b of the storage system 1a and a connector 507b of the storage system 1c are connected to each other. Moreover, a connector 508a of the storage system 1b and a connector 507a of the storage system 1d are connected to each other. Further, a connector 508b of the storage system 1b and a connector 507b of the storage system 1d are connected to each other.

As described above, the storage system 1 includes the I/F unit 12 connected to the memory unit 10 and the I/F unit 12 is connected to an I/F unit 12 of another storage system 1 in the first embodiment. It is possible to expand the memory unit 10 by this configuration. That is, it is possible to easily perform the scale-out of the memory unit 10 of the storage system 1.

In addition, as described above, the LVDS interfaces 419 are classified into the odd group and the even group. One of the two I/F cards 500 mounted on the backplane 300 corresponds to the collection of only the terminals of the odd group, and the other thereof corresponds to the collection of only the terminals of the even group. Accordingly, even when any one of the two I/F cards 500 is broken down, connection to the outside is maintained through the other I/F card 500 that is not broken down. Meanwhile, a case in which the LVDS interfaces 419 are classified into two types of groups, that is, the odd group and the even group has been described here. However, the LVDS interfaces 419 may be classified into three or more types of groups and terminals corresponding to the respective type of group may be collected in separate I/F cards 500.

[Second Embodiment]

In the first embodiment, the storage systems 1, which are accommodated in the enclosure 200, receive and interpret a request, which is sent from the outside, in the CUs 11. In a second embodiment, an enclosure 200 is formed without CUs 11 and can be directly connected to a memory unit 10 from the outside through a cable.

Figure 34:
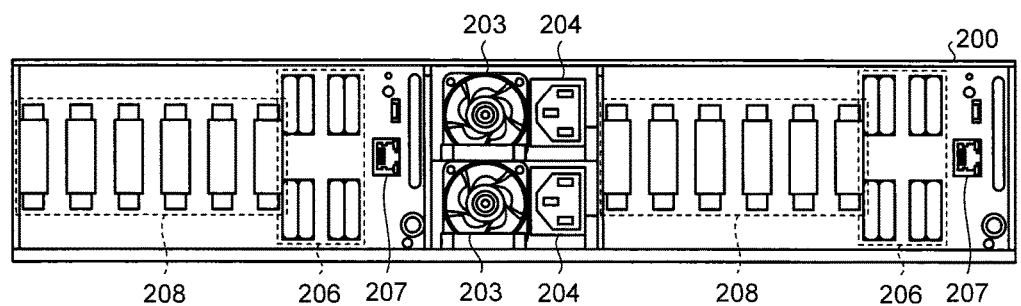
FIG. 34 is a diagram illustrating a rear view of an enclosure of a second embodiment.
Figure 35:
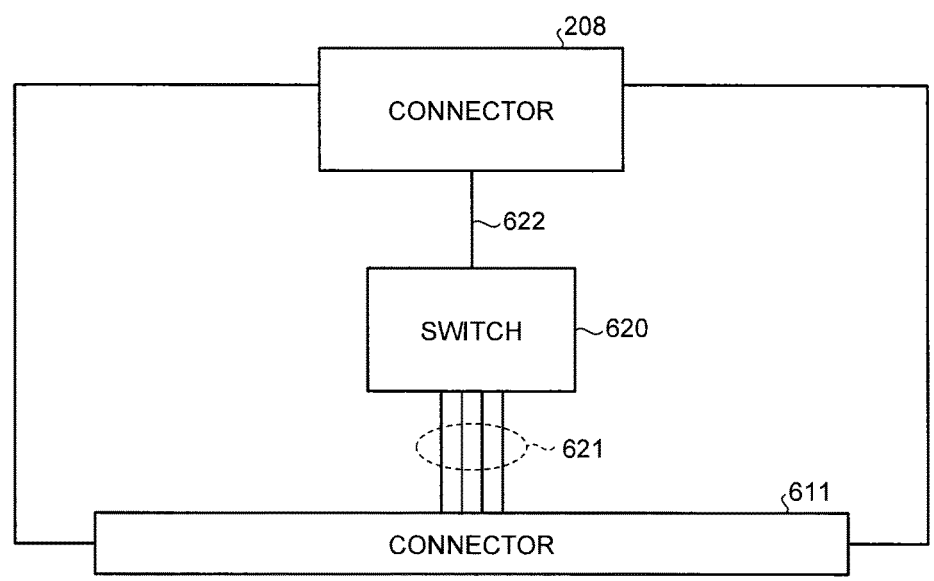
FIG. 35 is a block diagram illustrating the configuration of a CU card of the second embodiment.

FIG. 34 is a diagram illustrating a rear view of the enclosure 200 of the second embodiment. FIG. 35 is a block diagram illustrating the configuration of a CU card 600 of the second embodiment. The second embodiment is different from the first embodiment in terms of the configuration of the CU card 600. The CU card 600 includes a connector 208 that is a cable connector complying with a PCIe standard. Since a plurality of CU cards 600 is mounted on a backplane 300, the connectors 208 are arranged on the rear surface of the enclosure 200.

Further, the CU card 600 includes a switch 620 and a connector 611. The switch 620 is connected to the connector 611 through four PCIe interfaces 621, and is connected to the connector 208 through one PCIe interface 622. The switch 620 binds the four PCIe interfaces 621 into one PCIe interface 622. The four PCIe interfaces 621 are connected to different NM cards 400 through the connector 611 and the backplane 300.

Figure 36:
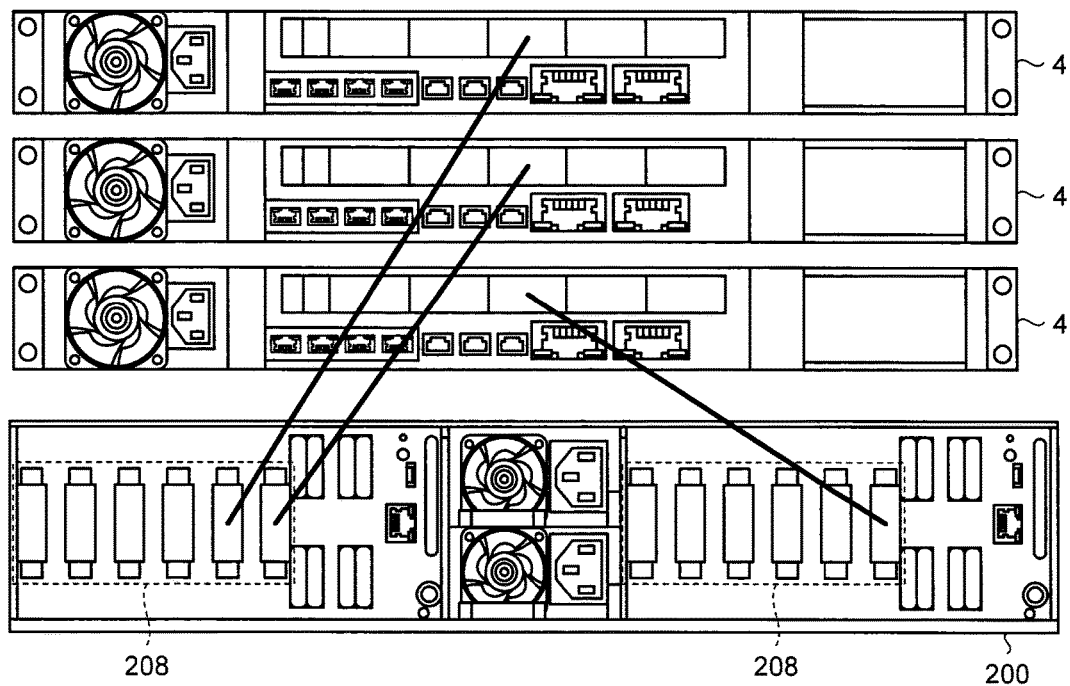
FIG. 36 is a diagram illustrating an example of the form of use of an enclosure of the second embodiment.

FIG. 36 is a diagram illustrating an example of the form of use of the enclosure 200 of the second embodiment. The enclosure 200 is connected to different connectors 208 from three PC servers 4. The respective connectors 208 are connected to the different PC servers 4 with a one-to-one relationship.

Meanwhile, an arbitrary standard can be employed as the standard of communication between the enclosure 200 and the PC server 4 as long as buses provided in the PC server 4 can be expanded to the outside of the PC server 4 by cabling.

In general, when a plurality of computers is connected to one memory unit through a bus-type network, accesses to the memory unit from the plurality of computers collide with each other. For this reason, a problem that overall performance is degraded (so-called Von Neumann bottleneck) occurs. According to the second embodiment, a plurality of PC servers 4 can be connected to the memory unit 10 through different connectors 208 and the memory unit 10 has a configuration in which the plurality of NMs 14 having a data transmission function is connected to one another through a mesh network. Accordingly, even if the plurality of PC servers 4 has access to one NM 14, accesses are distributed to a plurality of paths to the NM 14. As a result, according to the second embodiment, performance degradation caused by the collision of accesses hardly occurs.

Further, according to the second embodiment, an external PC server 4 directly can send a packet to the memory unit 10. Accordingly, it is possible to employ a configuration in which a server application program is executed on the external PC server 4. Even when the operating cost of the server application program is high, it is possible to prepare an external PC server 4 that fits to the operating cost.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A storage system comprising:

two storages, wherein each of the two storages includes a memory unit group that includes a plurality of first memory units connected to one another through a plurality of interfaces so that data is transmitted between the first memory units, and terminals that are connected to the memory unit group, and the two storages are connectable to each other through the terminals, wherein, the plurality of interfaces included in each of the two storages are classified into a first group and a second group which is different from the first group, the terminals included in each of the two storages include a first terminal and a second terminal, the first terminal is a bundle of terminals of interfaces belonging to the first group, the second terminal is a bundle of terminals of interfaces belonging to the second group, a memory unit among the plurality of first memory units included in one storage among the two storages is configured to transfer data to and from the plurality of first memory units included in the other storage among the two storages in a case that the one storage is connected to the other storage through the first terminal or the second terminal, and each of the plurality of first memory units included in each of the two storages is connected, through both of an interface belonging to the first group and an interface belonging to the second group, to at least two other first memory units among the plurality of first memory units.

2. The storage system according to claim 1, wherein
the plurality of first memory units included in each of the two storages includes a plurality of second memory units being connected to both of the first terminal and the second terminal.

3. The storage system according to claim 2, wherein
the plurality of second memory units are located on a first border of the plurality of the first memory units.

4. The storage system according to claim 3, wherein
the terminals included in each of the two storages further include a third terminal and a fourth terminal,
the plurality of first memory units included in each of the two storages further includes a plurality of third memory units,
the plurality of third memory units are located on a second border of the plurality of the first memory units,
the second border is on a side opposite to the first border,
the third terminal is connected to the plurality of the third memory units through interfaces belonging to the first group,
the fourth terminal is connected to the plurality of the third memory units through interfaces belonging to the second group, and
a memory unit among the plurality of first memory units included in the one storage is capable of transferring data to and from the plurality of first memory units included in the other storage in a case that the one storage is connected to the other storage through the third terminal or the fourth terminal.

5. The storage system according to claim 4, wherein
the third terminal included is connectable to the first terminal, and
the fourth terminal is connectable to the second terminal.

6. The storage system according to claim 1, wherein
each of the plurality of first memory units includes a plurality of memory nodes, and
a memory node among the plurality of memory nodes included in one first memory unit among the plurality of first memory units is connected to a memory node among the plurality of memory nodes included in another first memory unit among the plurality of first memory units through an interface belonging to the first group or an interface belonging to the second group.

* * * * *